(12) United States Patent
Hsu et al.

(10) Patent No.: US 9,382,112 B2
(45) Date of Patent: Jul. 5, 2016

(54) MANUFACTURING METHODS FOR MICRO-ELECTROMECHANICAL SYSTEM DEVICE HAVING ELECTRICAL INSULATING STRUCTURE

(71) Applicant: INDUSTRIAL TECHNOLOGY RESEARCH INSTITUTE, Hsinchu (TW)

(72) Inventors: Yu Wen Hsu, Tainan (TW); Shih Ting Lin, Hualien County (TW); Jen Yi Chen, Hsinchu County (TW); Chao Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 143 days.

(21) Appl. No.: 14/184,496

(22) Filed: Feb. 19, 2014

(65) Prior Publication Data
US 2014/0186987 A1    Jul. 3, 2014

Related U.S. Application Data

(62) Division of application No. 13/220,068, filed on Aug. 29, 2011, now Pat. No. 8,695,426.

(30) Foreign Application Priority Data

Dec. 23, 2010  (TW) ................. 99145427 A

(51) Int. Cl.
B81B 3/00 (2006.01)
B81C 1/00 (2006.01)
G01C 19/5762 (2012.01)

(52) U.S. Cl.
CPC ........... *B81C 1/00301* (2013.01); *B81B 3/0086* (2013.01); *G01C 19/5762* (2013.01); *B81B 2201/0242* (2013.01); *B81B 2207/07* (2013.01); *B81C 2203/0792* (2013.01)

(58) Field of Classification Search
CPC .............. G01L 9/0047; B81C 1/00182; B81B 2201/0264
See application file for complete search history.

(56) References Cited

U.S. PATENT DOCUMENTS

| | | | | |
|---|---|---|---|---|
| 6,848,310 B2 * | 2/2005 | Goto | ................... | G01P 15/0802 361/283.3 |
| 8,695,426 B2 * | 4/2014 | Hsu | ....................... | B81B 3/0086 73/504.12 |
| 2012/0001276 A1 * | 1/2012 | Huang | ................... | B81B 7/0064 257/416 |
| 2012/0160027 A1 * | 6/2012 | Hsu | ....................... | B81B 3/0086 73/504.08 |

* cited by examiner

*Primary Examiner* — Minh Trinh
(74) *Attorney, Agent, or Firm* — WPAT, P.C., Intellectual Property Attorneys; Anthony King

(57) ABSTRACT

A method for manufacturing a MEMS device includes the following operations. An SOI wafer including a device layer, an insulating layer and a handle layer is provided. The device layer is etched to form a recess and an annular protrusion surrounding the recess. A moving part and a spring of the MEMS device are formed on the recess by etching the device layer, the insulating layer and the handle layer. An anchor of the MEMS device is formed at the annular protrusion by etching the device layer, the insulating layer and the handle layer. The moving part and the anchor are connected to each other by the spring. The insulating layer is disposed between a first conductive portion and a second conductive portion of the moving part. The insulating layer is disposed between a first conductive portion and a second conductive portion of the anchor.

10 Claims, 24 Drawing Sheets ated gyroscope and FIG. 1B is a cross sectional view

MANUFACTURING METHODS FOR MICRO-ELECTROMECHANICAL SYSTEM DEVICE HAVING ELECTRICAL INSULATING STRUCTURE

CROSS-REFERENCE TO RELATED APPLICATION

The present application is a divisional application from the application Ser. No. 13/220,068, filed on Aug. 29, 2011, of the same title and inventorship herewith.

1. FIELD OF THE DISCLOSURE

The disclosure relates to a MEMS device having electrical insulating structure and manufacturing methods and, in particular, to a MEMS device having multi-path electrical interconnection.

2. BACKGROUND

In recent years, microelectromechanical system (MEMS) sensors have been widely used in consumer electronics. For example, MEMS motion sensors are used in mobile phones and MEMS gyroscopes are used in interactive games. Therefore, MEMS sensors need to have dominant competitiveness such as small size or low manufacturing cost in order to enter the market of consumer electronics product.

In the product launch of Year 2010, Apple Inc. has officially announced that iPhone 4G cell phone is built-in a tri-axial MEMS gyroscope ("MEMS-Gyro") so that the cell phone has the function with more realistic interactive game. Such trend represents that the MEMS-Gyro market will enter a period of high-speed growth. Therefore, high sensitivity and low cost will be the competitive advantages in the high-speed growing MEMS-Gyro market.

FIG. 1A is the top view of the simplified schematic of a traditional gyroscope and FIG. 1B is a cross sectional view taken along the line 1-1 in FIG. 1A. The gyroscope 10 comprises a substrate 16, a proof mass 11, a plurality of first springs 12, a frame 13, a plurality of second springs 14 and a plurality of anchors 15. The plurality of first springs 12 are connected to the proof mass 11 and the frame 13. The frame 13 surrounds the plurality of first springs 12 and the proof mass 11. The plurality of second springs 14 are connected to the frame 13 and the plurality of anchors. The plurality of anchors are fixed on the substrate 16.

While the gyroscope 10 is active, a voltage is applied to the frame 13 and the proof mass 11 respectively, and then the frame 13 is driven to oscillate periodically along the X-axis, such that the proof mass 11 is driven to move along the X-axis. The electrical signal generated by the oscillation of the frame 13 is sensed by a movable comb structure (not shown) of the frame 13 and a fixed comb structure (not shown) on the substrate 16 and transmitted to an external ASIC chip. Then, the frame 13 is driven again by the circuit of the ASIC chip, and oscillates stably within the expected frequency range If the gyroscope 10 senses angular velocity along the Z-axis, the proof mass 11 will move along the Y-axis at the same time. The movable comb structure (not shown) on the proof mass 11 and the fixed comb structure (not shown) on the substrate 16 generate another electrical signal due to the movement of the proof mass 11. The electrical signal will then be transmitted to the ASIC chip for calculating the angular velocity.

For driving the frame effectively, it is better to apply a higher voltage to the frame 13. At the same time, the lower voltage is applied to the proof mass for obtaining higher sensitivity of gyroscope. However, since the frame 13 and the proof mass 11 of the traditional gyroscope 10 use the same electrical path, as shown with the electrical paths a and b in FIGS. 1A and 1B, it is impossible to apply higher voltage to the frame 13 and to apply lower voltage to the proof mass 11 respectively.

U.S. Patents (U.S. Pat. No. 6,239,473, U.S. Pat. No. 6,433,401 and U.S. Pat. No. 6,291,875) disclose a proof mass with one independent electrical path or two independent electrical paths by using the insulating layer along the vertical axis (Z-axis), the isolating trench along the vertical axis (Z-axis) and the suspended structure. However, the suspended structure is formed by etching the lower portion of the structure to form the gap under the structure. Thus, it is impossible to create a relatively large suspended arm or suspended mass, such as proof mass of accelerometers or gyroscopes. In addition, due to the limitation of the process for forming the isolating trench, it is impossible that the isolating trench along the vertical axis (Z-axis) is formed on the springs 12 and 14 of the gyroscope 10 in FIG. 1. Therefore, the electrical signals of the proof mass 11 and the frame 13 will still be transmitted through the same electrical paths such as the springs 14 of the gyroscope 10.

SUMMARY

One embodiment of the disclosure discloses a MEMS device having an electrical insulating structure. The MEMS device comprises at least one moving part, at least one anchor, at least one spring and an insulating layer. The spring is connected to the anchor and to the moving part. The insulating layer is disposed in the moving part and the anchor, wherein each of the moving part and the anchor is divided into a first conductive portion and a second conductive portion by the insulating layer.

Another embodiment of the disclosure discloses a MEMS device having an electrical insulating structure. The MEMS device comprises a substrate, at least one moving part, at least one anchor, at least one spring and an insulating layer. The substrate has a plurality of metal bonding areas disposed on the upper surface of the substrate. The anchor is fixed on the substrate. The insulating layer is disposed in the moving part, the anchor and the spring. The moving part is divided into a first conductive portion and a second conductive portion by the insulating layer. The anchor is divided into a first conductive portion and a second conductive portion by the insulating layer. The spring is divided into a first conductive portion and a second conductive portion by the insulating layer, The anchor comprises at least one first insulating portion and at least one conductive pillar. The second conductive portion of the anchor is divided into an outer conductive portion and an inner conductive portion by the first insulating portion. The conductive pillar is connected to the outer conductive portion and the first conductive portion of the at least one anchor. The outer conductive portion and the inner conductive portion of the anchor are respectively fixed on the metal bonding portions that are spaced apart. The first conductive portion of the spring is connected to the first conductive portion of the anchor. The second conductive portion of the spring is connected to the inner conductive portion of the anchor.

Another embodiment of a MEMS device having an electrical insulating structure is provided. The MEMS device comprises a substrate, at least one first moving part, at least one second moving part, at least one anchor, at least one first spring, at least one second spring and an insulating layer. The substrate includes a plurality of metal bonding areas disposed on the upper surface of the substrate. The insulating layer is disposed in the first moving part, the second moving part, the anchor, the first spring and the second spring. The first moving part is divided into a first conductive portion and a second conductive portion by the insulating layer. The second moving part is divided into a first conductive portion and a second conductive portion by the insulating layer. The anchor is divided into a first conductive portion and a second conductive portion by the insulating layer. The first spring is divided into a first conductive portion and a second conductive portion by the insulating layer. The second spring is divided into a first conductive portion and a second conductive portion by the insulating layer.

The first conductive portion of the first spring is connected to the first conductive portion of the first moving part and the first conductive portion of the at least one second moving part. The first conductive portion of the second spring is connected to the first conductive portion of the second moving part and to the first conductive portion of the anchor. The first moving part comprises at least one conductive pillar connected to the first conductive portion of the first moving part and to the second conductive portion of the first moving part. The anchor comprises at least one first insulating portion and at least one conductive pillar. The second conductive portion of the anchor is divided into an outer conductive portion and an inner conductive portion by the first insulating portion. The conductive pillar is connected to the outer conductive portion and the first conductive portion of the at least one anchor. The outer conductive portion and the inner conductive portion of the anchor are respectively fixed on the metal bonding areas that are spaced apart.

The second moving part has at least one second insulating portion. The second conductive portion of the second moving part is divided into an outer conductive portion and an inner conductive portion by the second insulating portion. The second conductive portion of the first spring is connected to the second conductive portion of the first moving part and to the inner conductive portion of the second moving part. The second conductive portion of the second spring is connected to the outer conductive portion of the second moving part and the inner conductive portion of the anchor.

Another embodiment of the disclosure discloses a method of manufacturing a MEMS device having an insulating structure. The method comprises the following steps. First, a Silicon on Insulator (SOI) wafer is provided, wherein the SOI wafer includes a device layer, an insulating layer and a handle layer which are stacked in order. Then, the device layer is etched to form a recess and at least one annular protrusion. Then, the annular protrusion is etched to form at least one first trench, and the recess is etched to form a second trench, wherein the first trench and the second trench extend through the insulating layer. Then, the annular protrusion is bonded with a substrate. Then, the handle layer is thinned. Then, a portion of the handle layer corresponding to the at least one first trench is etched to form a plurality of first holes, and a portion of the handle layer corresponding to a middle area of the recess is etched to form at least one second hole, wherein the plurality of first holes and the at least one second holes extend through the insulating layer and to the device layer. Then, the first holes and the second hole are filled with conductive material. Then, the device layer, the insulating layer and the handle layer are etched to form at least one first moving part, at least one second moving part, at least one anchor, at least one first spring connected to the first moving part and the second moving part, and at least one second spring connected to the second moving part and the anchor. The first moving part comprises the second hole, and the anchor comprises the first trench and the first holes.

In order to have further understanding of the techniques, means, and effects of the disclosure, the following detailed description and drawings are hereby presented, such that the purposes, features and aspects of the disclosure may be thoroughly and concretely appreciated; however, the drawings are provided solely for reference and illustration, without any intention to be used for limiting the disclosure.

DETAILED DESCRIPTION

Figure 1A:
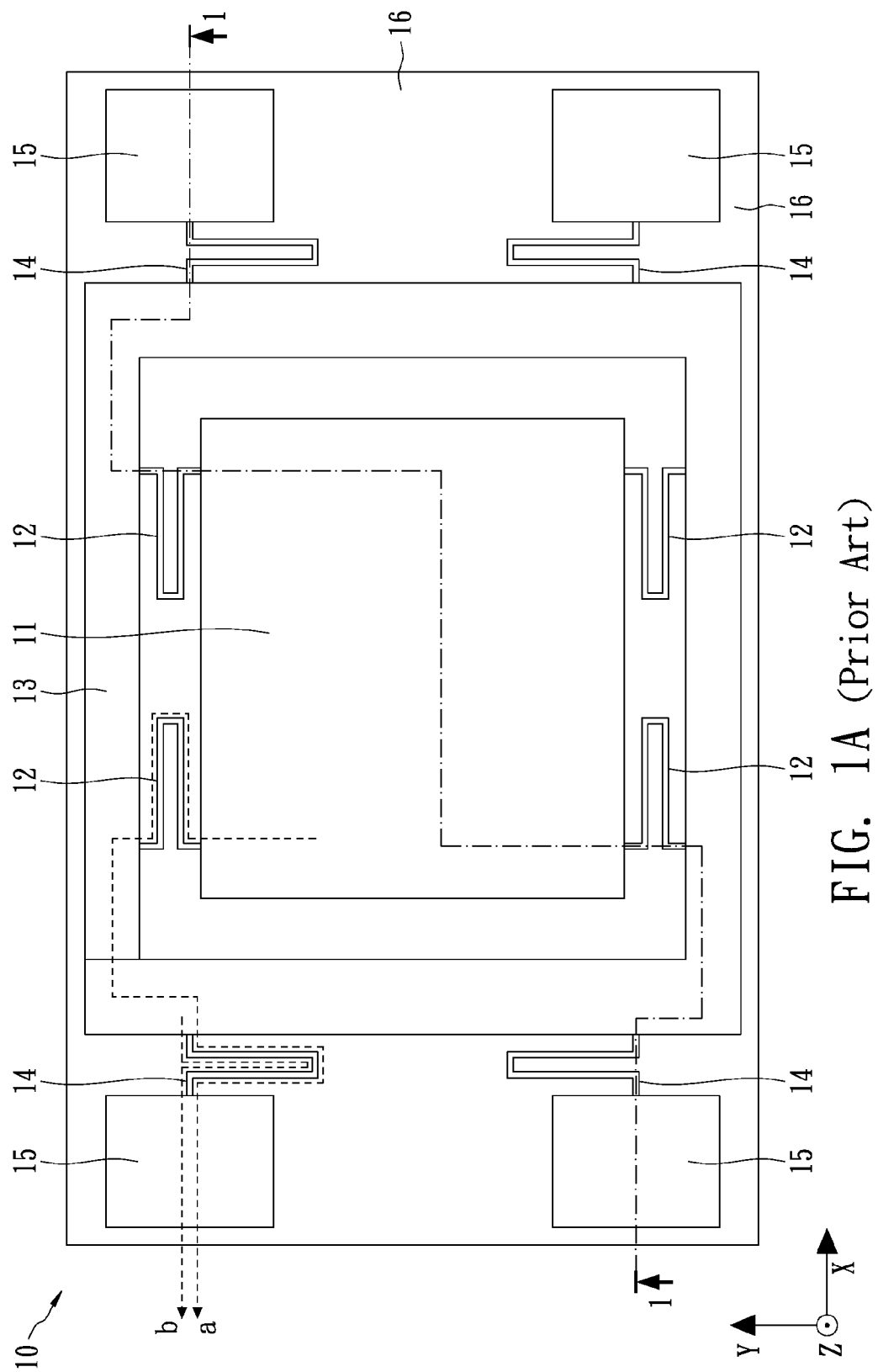
FIG. 1A is a top view of a simplified schematic of a traditional gyroscope.
Figure 1B:
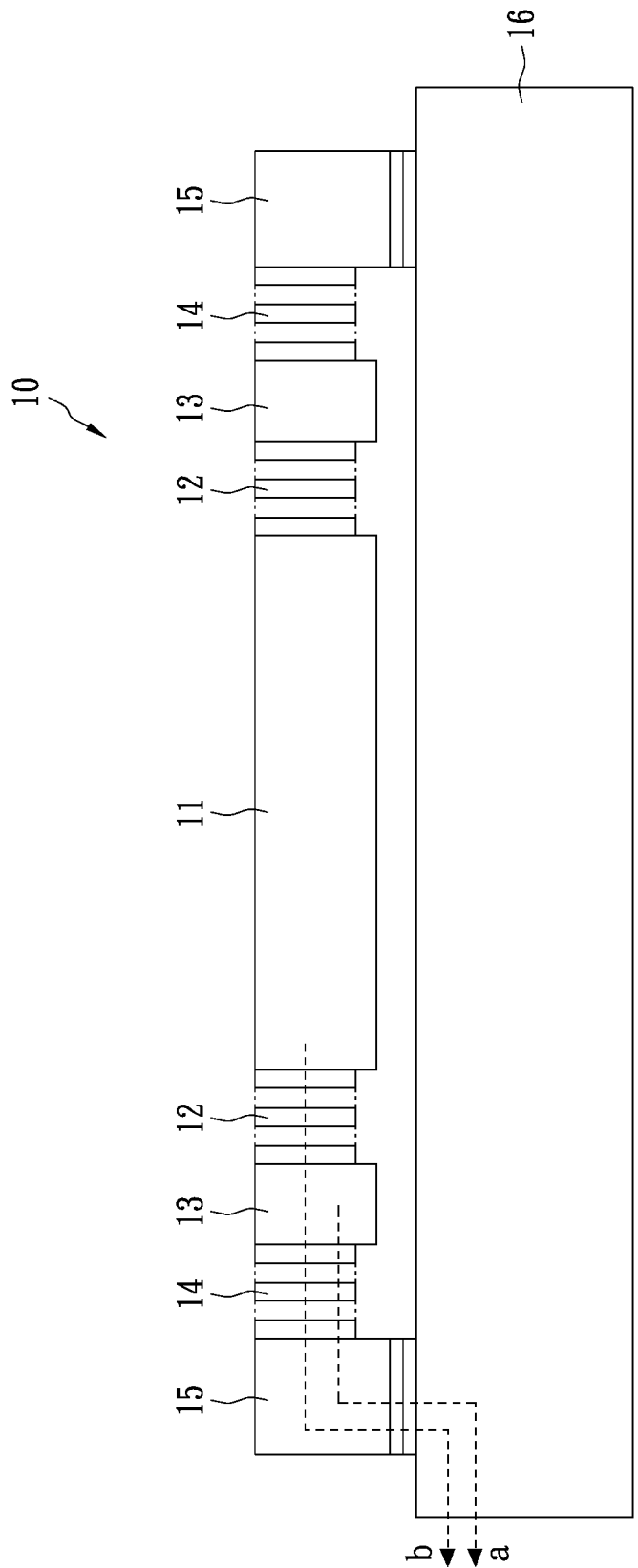
FIG. 1B is a cross sectional view taken along the line 1-1 in FIG. 1A.
Figure 2A:
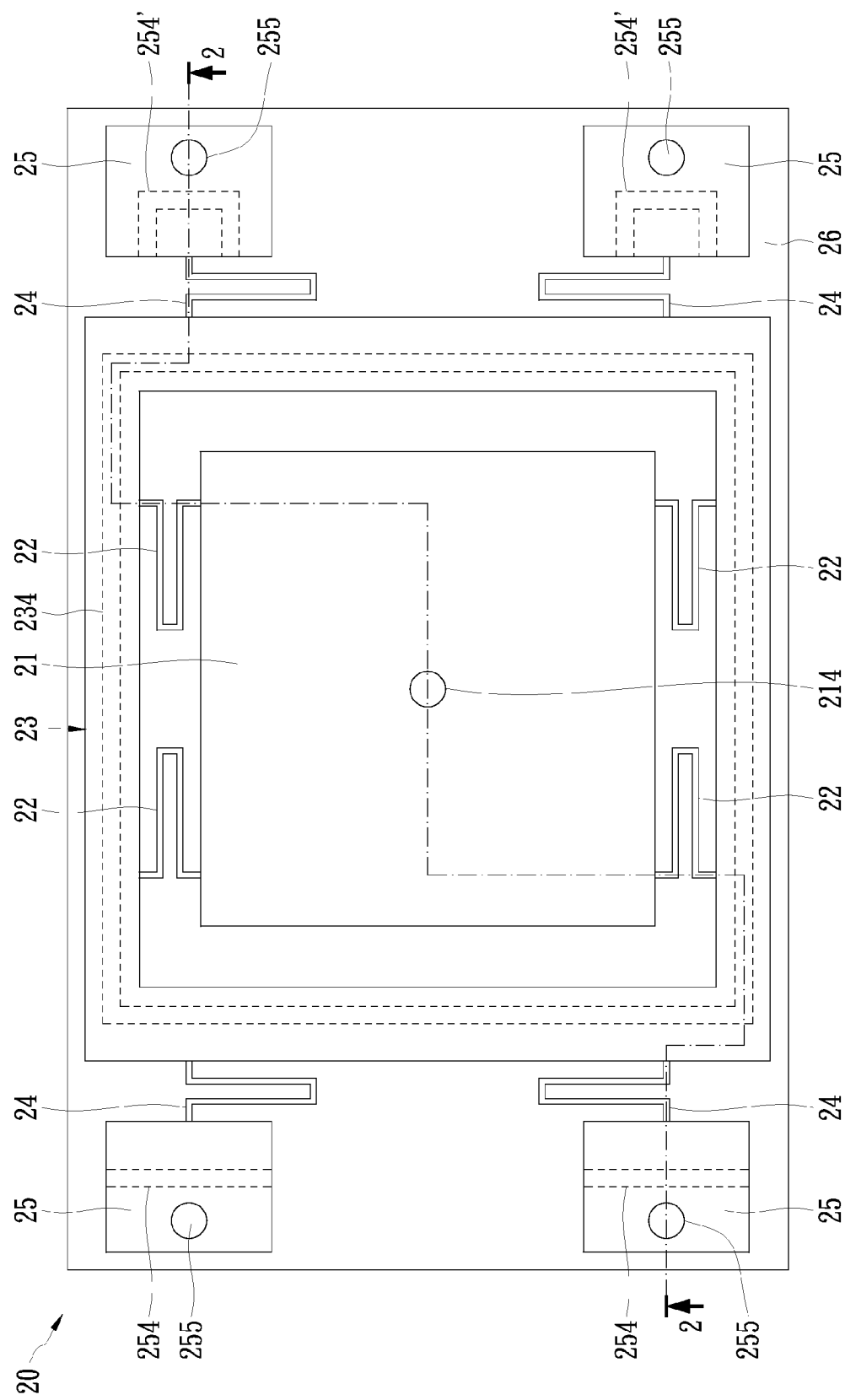
FIG. 2A is a top view of a MEMS device having an insulating structure of one embodiment of the disclosure.
Figure 2B:
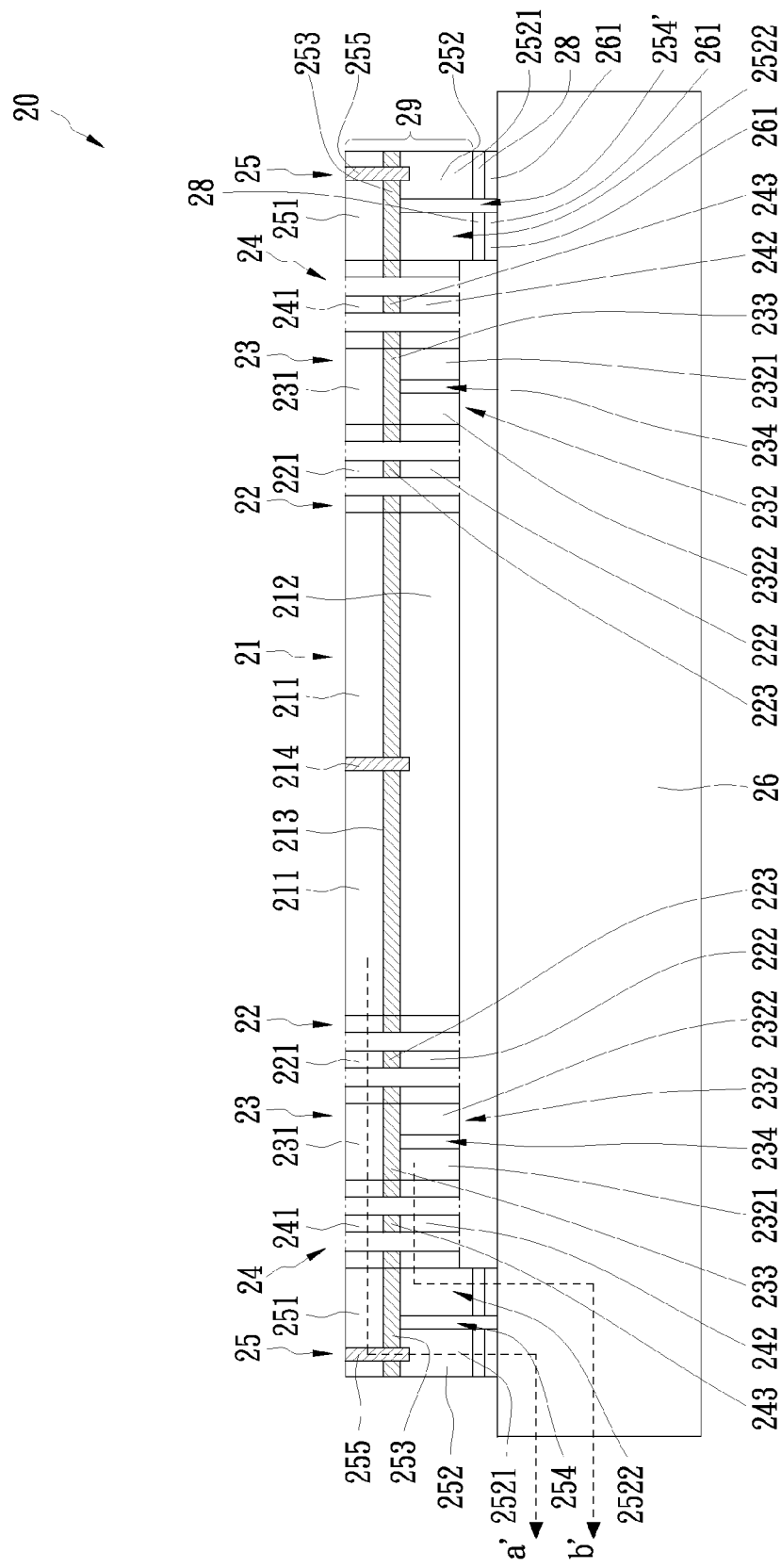
FIG. 2B is a cross sectional view taken along the line 2-2 in FIG. 2A.

FIG. 2A is a top view of a MEMS device having an insulating structure of one embodiment of the disclosure, while FIG. 2B is a cross sectional view taken along the line 2-2 in FIG. 2A. The MEMS device 20 comprises a substrate 26, a first moving part 21, a second moving part 23, at least one first spring 22, at least one second spring 24 and at least one anchor 25 and an insulating layer (213, 223, 233, 243, 253). The substrate 26 is a glass substrate or Si substrate. The first moving part 21, the second moving part 23, each of the first springs 22, each of the second springs 24 and each of the anchors 25 are formed from a SOI (silicon on insulator) wafer.

The insulating layer (213, 223, 233, 243, 253) is disposed in the first moving part 21, the at least one first spring 22, the second moving part 23, the at least one second spring 24 and the at least one anchor 25 respectively. The first moving part 21 is divided into a first conductive portion 211 and a second conductive portion 212 by the insulating layer 213. The second moving part 23 is divided into a first conductive portion 231 and a second conductive portion 232 by the insulating layer 233. The at least one anchor 25 is divided into a first conductive portion 251 and a second conductive portion 252 by the insulating layer 253. The at least one first spring 22 is divided into a first conductive portion 221 and a second conductive portion 222 by the insulating layer 223. The at least one second spring 24 is divided into a first conductive portion 241 and a second conductive portion 242 by the insulating layer 243.

While the at least one first spring 22 are connected to the first moving part 21 and the second moving part 23, the first conductive portion 221 of the at least one first spring 22 is connected to the first conductive portion 211 of the first moving part 21 and to the first conductive portion 231 of the second moving part 23, and the second conductive portion 222 of the at least one first spring 22 is connected to the second conductive portion 212 of the first moving part 21 and to an inner conductive portion 2322 of the second moving part 23. The at least one second spring 24 are connected to the second moving part 23 and the at least one anchor 25, while the first conductive portion 241 of the at least one second spring 24 is connected to the first conductive portion 231 of the second moving part 23 and to the first conductive portion 251 of the at least one anchor 25. The second conductive portion 242 of the second spring 24 is connected to an outer conductive portion 2321 of the second moving part 23 and to an inner conductive portion 2522 of the at least one anchor 25.

The at least one anchor 25 are arranged around the first moving part 21 and the second moving part 23 and are fixed on the substrate 26. At least one of the anchors 25 includes a first insulating portion (254, 254') and a first conductive pillar 255. The first insulating portion (254, 254') is disposed in the second conductive portion 252 of the at least one anchor 25, such that the second conductive portion 252 of the at least one anchor 25 is divided into an outer conductive portion 2521 and an inner conductive portion 2522 by the first insulating portion (254, 254'). The inner conductive portion 2522 is defined as the conductive portion which is closer to the center of the first moving part 21. The first conductive pillar 255 passes through the insulating layer 253 and is connected to the outer conductive portion 2521 of the at least one anchor 25 and to the first conductive portion 251 of the at least one anchor 25. The first insulating portion 254 and 254' can be a strip type trench or a U-shaped trench, or the first insulating portion 254 and 254' can be a strip type trench or a U-shaped trench filled with insulating material to from an insulating wall (not shown) disposed between the outer conductive portion 2521 and the inner conductive portion 2522.

The first moving part 21 includes at least one second conductive pillar 214 connected to the first conductive portion 211 and the second conductive portion 212. That is, the second conductive pillar 214 extends through the insulating layer 213 between the first conductive portion 211 and the second conductive portion 212, such that the first conductive portion 211 and the second conductive portion 212 are electrically connected. Thus, the first conductive portion 211 and the second conductive portion 212 can function as a proof mass of an inertial sensor such as a gyroscope or accelerometer. The second moving part 23 includes at least one second insulating portion 234. The second insulating portion 234 is disposed in the second conductive portion 232 of the second moving part 23, such that the second conductive portion 232 of the second moving part 23 is divided into an outer conductive portion 2321 and an inner conductive portion 2322 by the second insulating portion 234. The inner conductive portion 2322 is defined as the conductive portion which is closer to the center of the first moving part 21. The second insulating portion 234 is a trench or an insulating wall (not shown) formed by insulating material.

The first moving part 21, the second moving part 23, the at least one first spring 22, the at least one second spring 24 and the at least one anchor 25 can be used for sensing physical motion, such as acceleration and angular velocity, and the assembly thereof is referred as a sensing element 29 in the disclosure. The at least one anchor 25 of the sensing element 29 are bonded with a plurality of metal bonding areas 261 of the substrate 26 by conductive bonding material 28 such as silver paste. Moreover, the outer conductive portion 2521 of the at least one anchor 25 and the inner conductive portion 2522 of the at least one anchor 25 can be connected to different metal bonding areas 261 respectively by the wafer-to-wafer bonding process such as wafer-to-wafer metal bonding process.

The electrical paths are shown as arrows a' and b' in FIG. 2B. The electrical signal generated by the first moving part 21 passes through the first conductive portion 221 of the at least one first spring 22, the first conductive portion 231 of the second moving part 23 and the first conductive portion 241 of the at least one second spring 24, and then arrives at the first conductive portion 251 of the at least one anchor 25. Since the first conducting pillar 255 is connected to the outer conductive portion 2521 of the at least one anchor 25, the electrical signal of the first moving part 21 can be transmitted to a conductive trace (not shown) on the substrate 26 from the outer conductive portion 2521 of the at least one anchor 25. The electrical signal of the first moving part 21 is transmitted through the second conductive portion 212 of the first moving part 21 and the second conductive portion 222 of the at least one first spring 22, then arrives at inner conductive portion 2322 of the second moving part 23 and is insulated by the second insulating portion 234 of the second moving part 23, such that the electrical signal of the first moving part 21 cannot be further transmitted. However, the electrical signal generated by the second moving part 23 can be transmitted from the outer conductive portion 2321 of the second moving part 23 through the second conductive portion 242 of the at least one second spring 24 and the inner conductive portion 2522 of the at least one anchor 25 to another conductive trace (not shown) on the substrate 26. Therefore, the electrical signals of the first moving part 21 and the electrical signals of second moving part 23 are transmitted through the insulated electrical paths, indicated by arrows a' and b', which are not electrically connected.

Figure 3A:
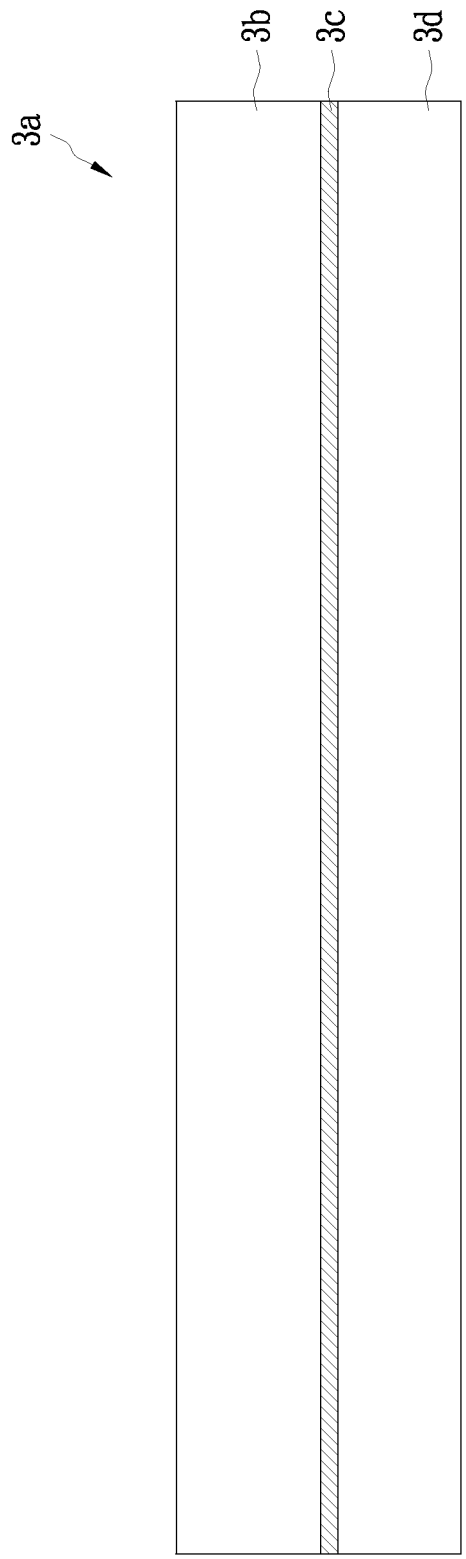
FIGS. 3A to 3H are schematics of manufacturing steps of a integrated device of an embodiment of the disclosure.

FIGS. 3A to 3H are schematics of manufacturing steps of an integrated device of an embodiment of the disclosure. As shown in FIG. 3A, an SOI wafer 3a is provided. The SOI wafer 3a includes a device layer 3d, an insulating layer 3c and a handle layer 3b which are stacked in order.

Figure 3B:
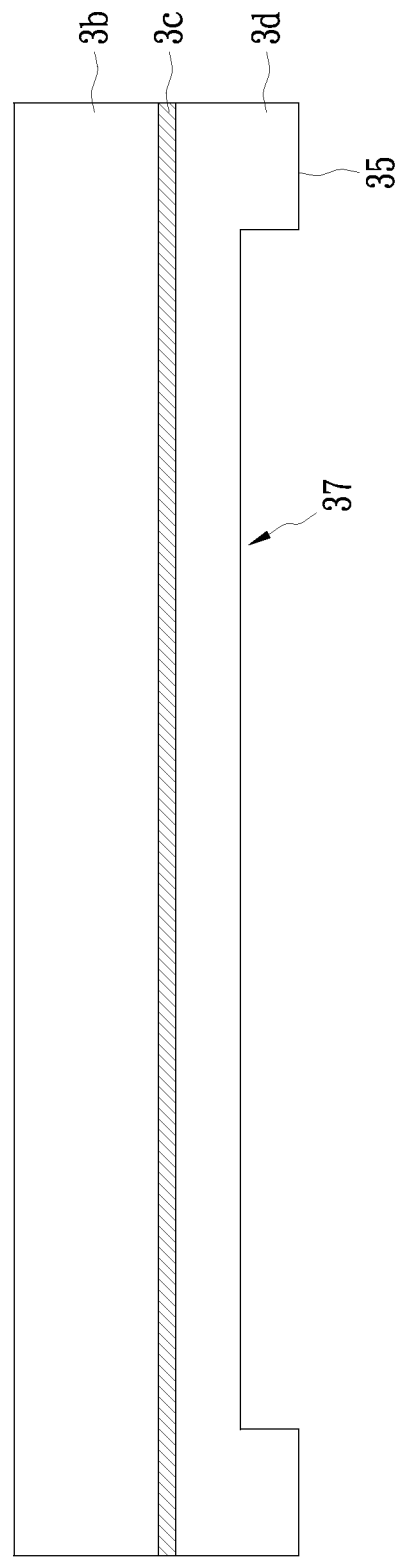
Figure 3C:
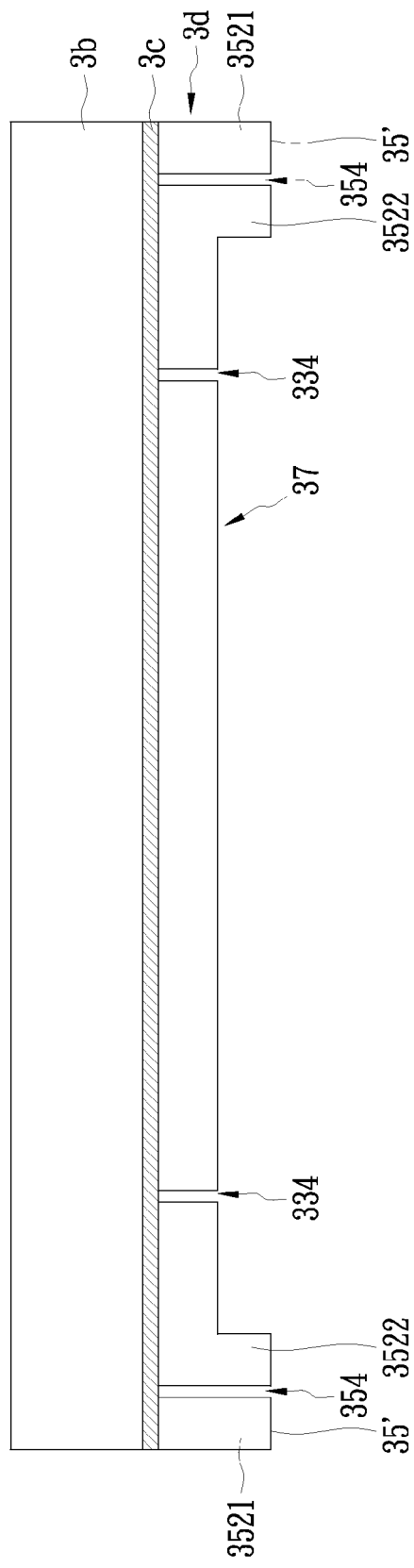

Referring to FIG. 3B, a large portion of the area of the device layer 3d is etched to form a recess 37 which is surrounded by an annular protrusion 35. Then, as shown in FIG. 3C, the annular protrusion 35' is etched to form a first trench 354, and the recess 37 is etched to form a second trench 334. The first trench 354 and the second trench 334 extend to the insulating layer 3c. The first trench 354 is disposed in the annular protrusion 35', such that the annular protrusion 35' is divided into an outer conductive portion 3521 and an inner conductive portion 3522 by the first trench 354. The first trench 354 and the second trench 334 can be filled with electrical insulating material to form an insulating wall. It is to be noted that the portion in which the first trench 354 is disposed will become at least one anchor 35 in the following step (FIG. 3H).

Figure 3D:
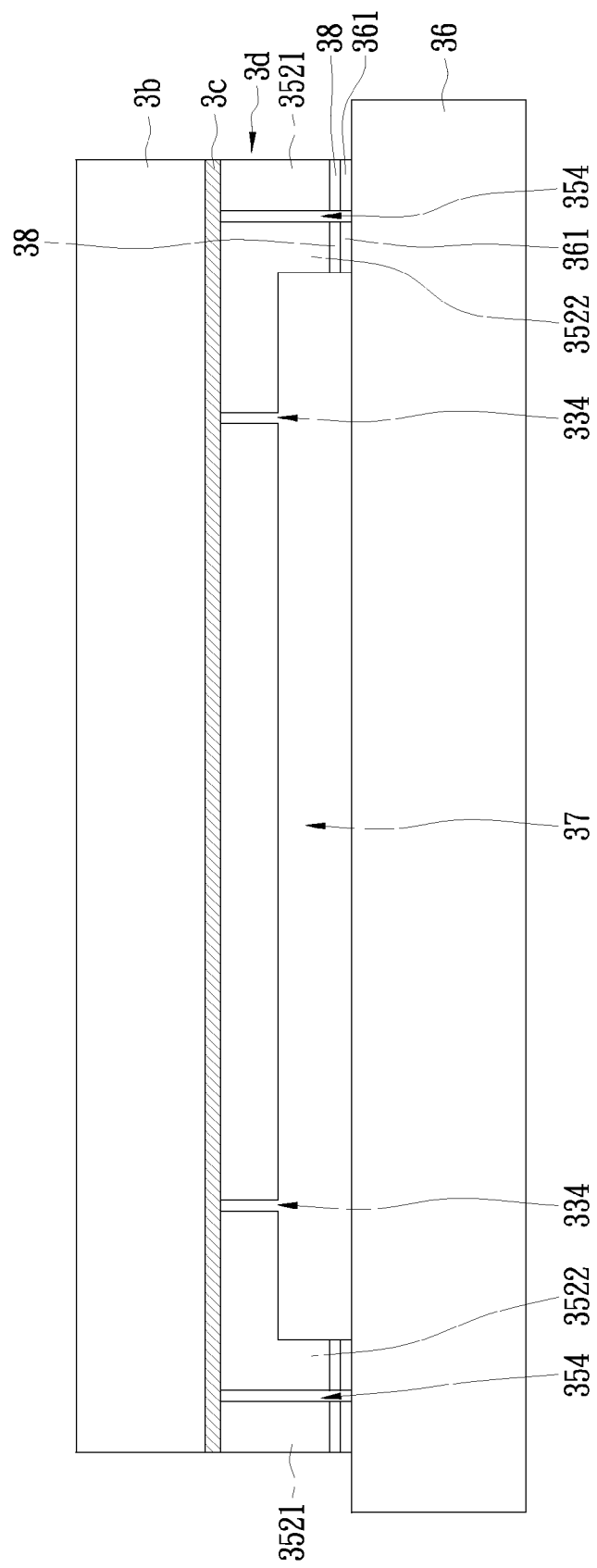
Figure 3E:
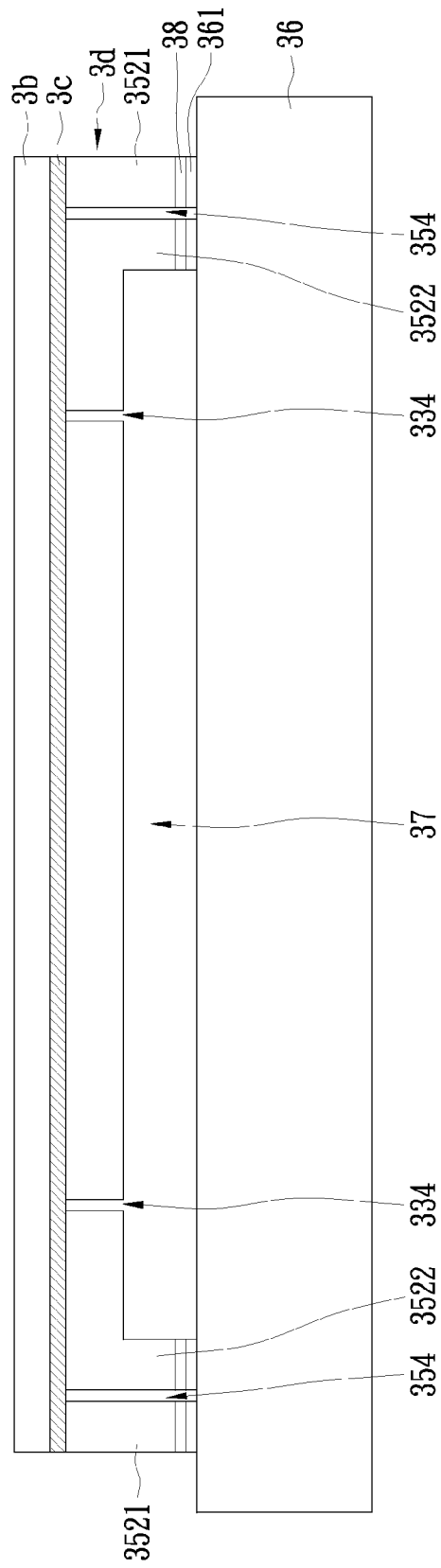

Referring to FIG. 3D, the annular protrusion 35' is bonded with a plurality of metal bonding areas 361 of a substrate 36 by conductive bonding material 38 such as silver paste. The substrate 36 can be a glass substrate or silicon substrate with metal trace on the surface thereof. The substrate 36 can also be a circuit chip having metal trace on the surface thereof. The present embodiment can be implemented by a wafer-to-wafer metal bonding process which uses the conductive bonding material to bond the annular protrusion 35' with the metal bonding areas 361 of a substrate 36 and is easily implemented for mass production. Subsequently, the handle layer 3b is thinned for further steps, as shown in FIG. 3E.

Figure 3F:
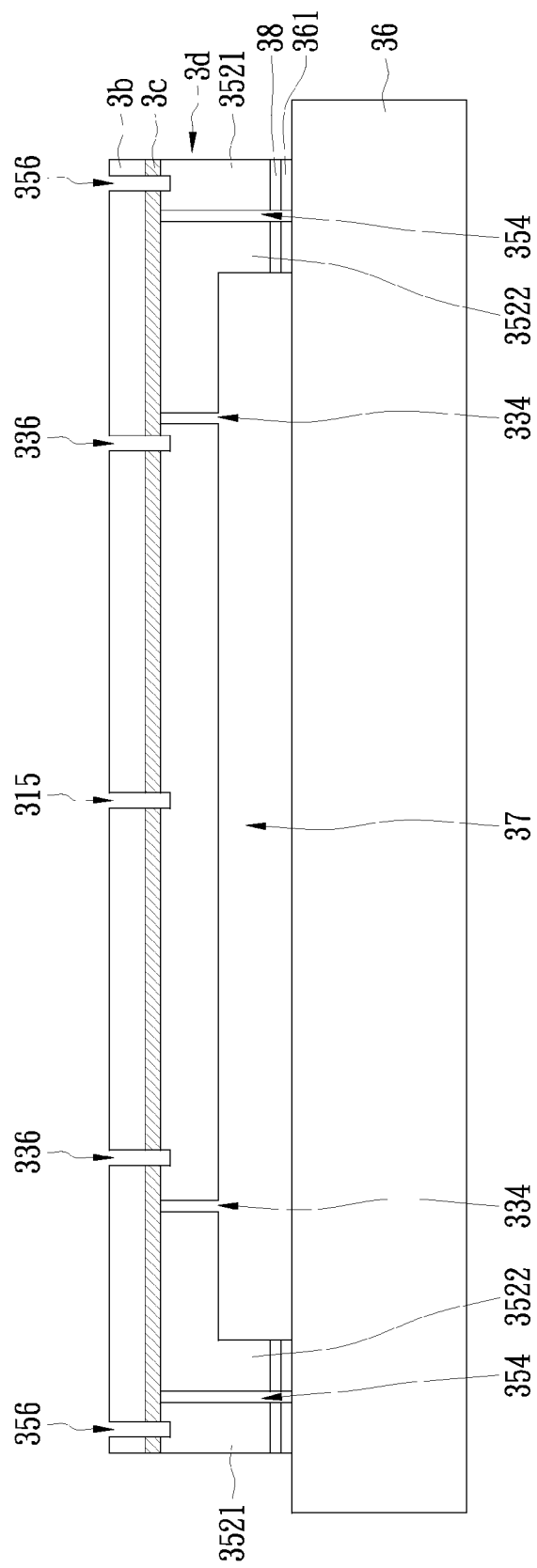
Figure 3G:
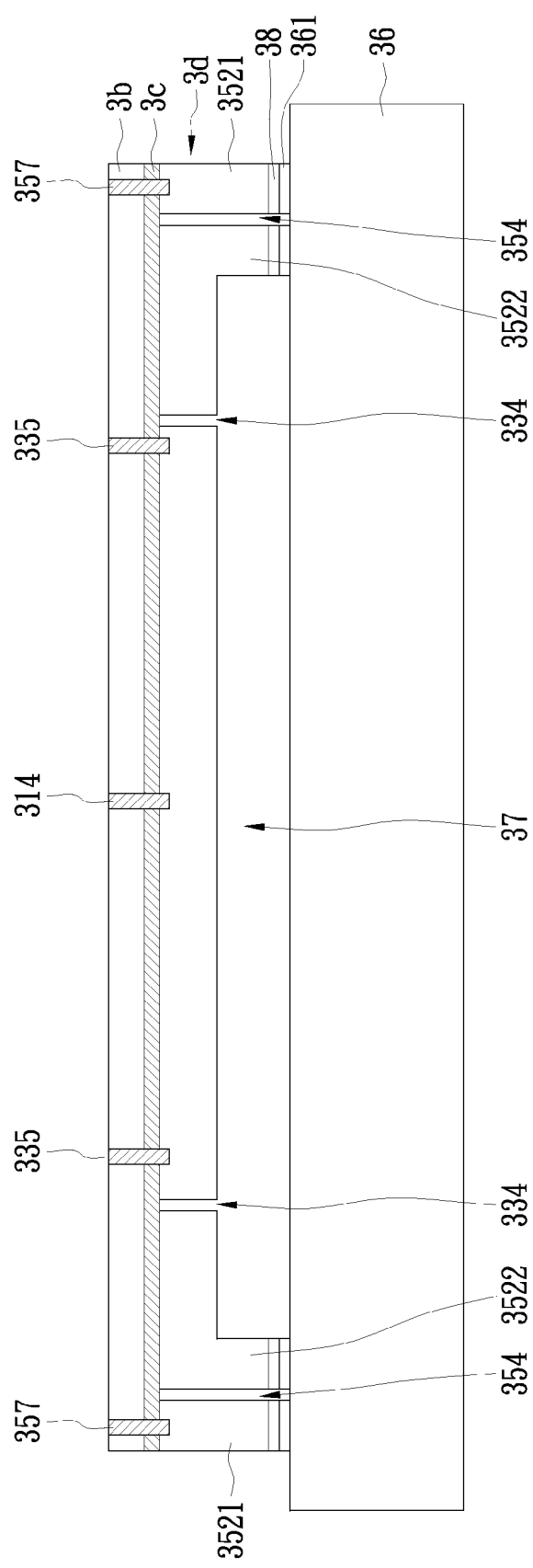

As shown in FIG. 3F, the thinned handle layer 3b corresponding to the outer conductive portion 3521 is etched to form a plurality of first holes 356. The area on the thinned handle layer 3b corresponding to the center between the second trenches 334 is etched to form at least one second hole 315. The area on the handle layer 3b corresponding to the second trench 334 can be etched to form a plurality of third holes 336. The first, second and third holes 356, 315 and 336 extend through the insulating layer 3c and to the device layer 3d. In this embodiment, the first holes 356 are disposed at the periphery of the thinned handle layer 3b, and the portion in which the first holes 356 are disposed will become at least one anchor 35 in the following step (FIG. 3H). The at least one second hole 315 is disposed substantially at the center of the thinned handle layer 3b, and the portion in which the at least one second hole 315 is disposed will become at least one first moving part 31 in the following step (FIG. 3H). The third holes 336 are disposed between the first holes 356 and the at least one second hole 315, and the portion in which the third holes 336 are disposed will become a second moving part 33 in the following step (FIG. 3H). As shown in FIG. 3G, the plurality of first holes 356, the at least one second hole 315 and the plurality of third holes 336 are filled with conductive materials such as copper or aluminum in order to create a plurality of first conductive pillars 357, at least one second conductive pillar 314, and at least one of third conductive pillars 335.

Figure 3H:
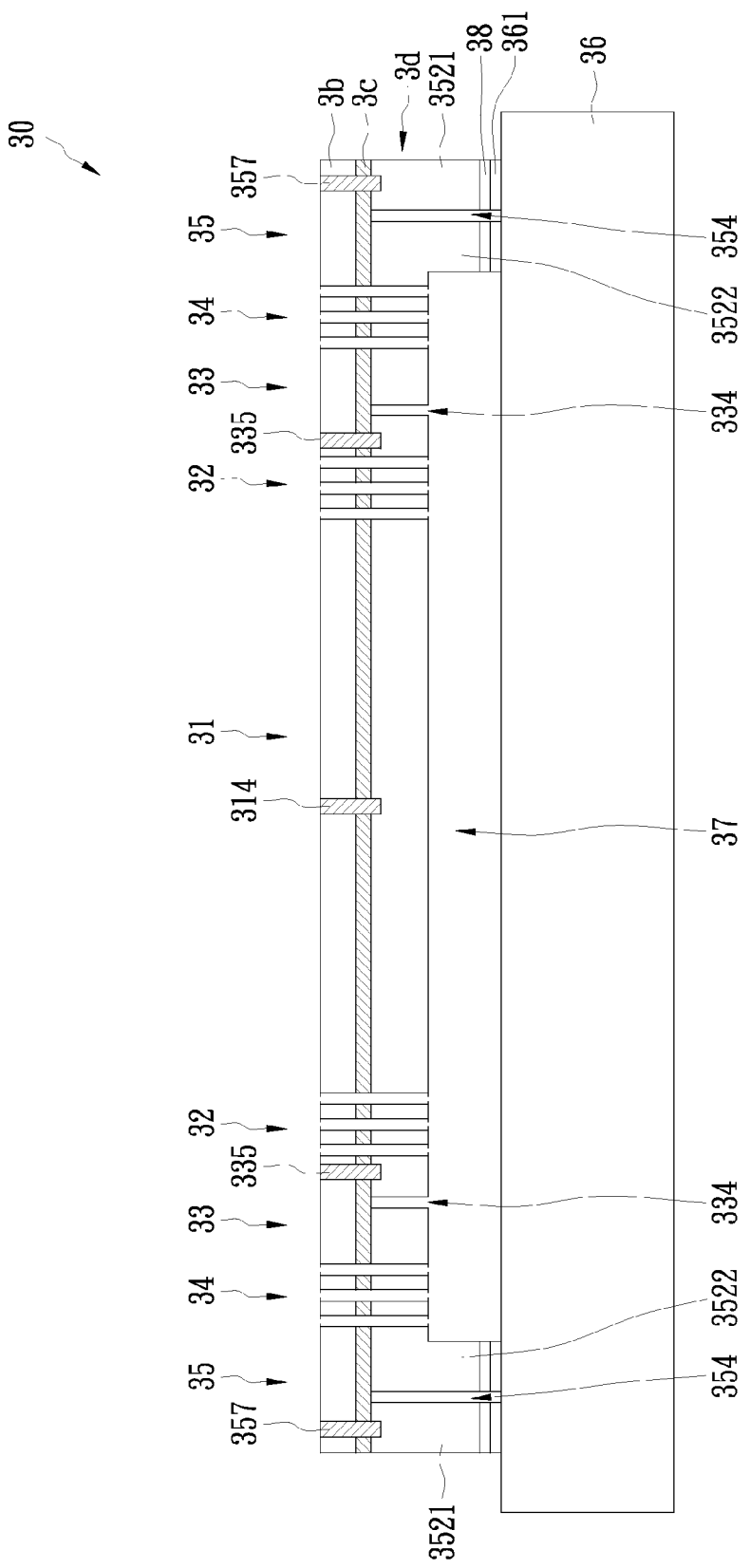

As shown in FIG. 3H, the device layer 3d, the insulating layer 3c and the handle layer 3b corresponding to the recess 37 are etched to form at least one first springs 32, at least one second spring 34, at least one first moving part 31, at least one second moving part 33. And at least one anchor 25 is formed by etching the device layer 3d, the insulating layer 3c and the handle layer 3b corresponding to the annular protrusion 35'. Accordingly, a MEMS device 30 having electrical insulating structure is obtained.

Figure 4:
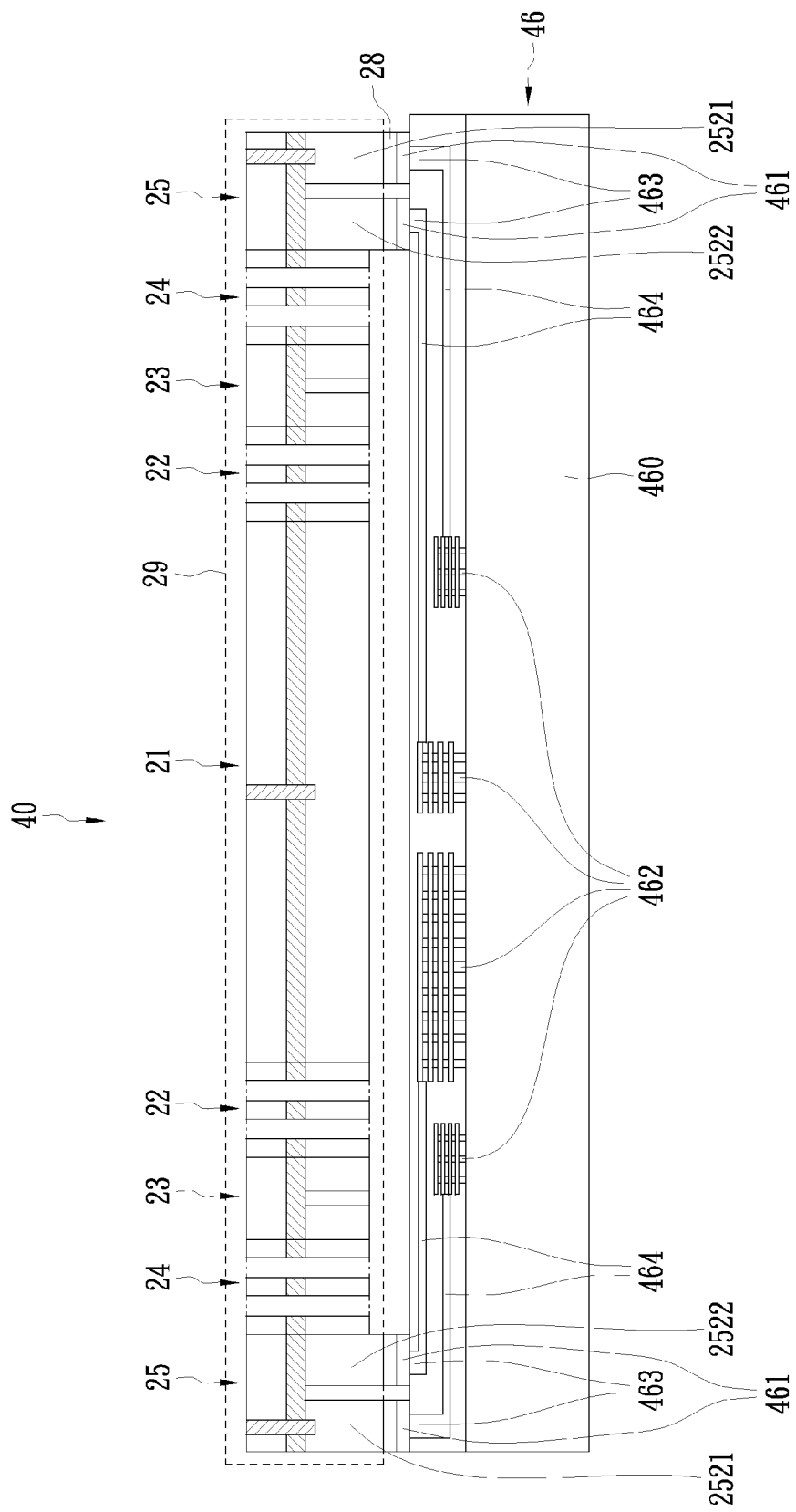
FIG. 4 is a cross sectional view of a MEMS device having an insulating structure of an embodiment of the disclosure.

FIG. 4 shows a cross sectional view of a MEMS device having an electrical insulating structure of an embodiment of the disclosure. The MEMS device 40 comprises a sensing element 29 (as shown in FIG. 2B) and an integrated circuit chip (IC chip) 46. The IC chip 46 of this embodiment comprises a silicon substrate 460, a plurality of metal bonding areas 461 and a plurality of circuit areas 462. The plurality of metal bonding areas 461 are disposed on the surface of the IC chip 46 and are electrically connected to the circuit areas 462. While the sensing element 29 and the IC chip 46 are bonded by wafer-to-wafer bonding process using metal bonding material, the outer conductive portion 2521 of each of the anchor 25 and inner conducive portion 2522 of each of the anchor 25 are connected respectively to the different metal bonding areas 461 that are spaced apart.

Each of the metal bonding area 461 is electrically connected to at least one conductive trace 464 by at least one metal pillar 463 respectively, and the conductive trace 464 is electrically connected to a circuit area 462. The electrical signal of the first moving part 21 and the electrical signal of the second moving part 23 are transmitted to circuit areas 462 respectively through the separated metal bonding areas 461, the different metal pillars 463 and the different conductive trace 464.

Figure 5:
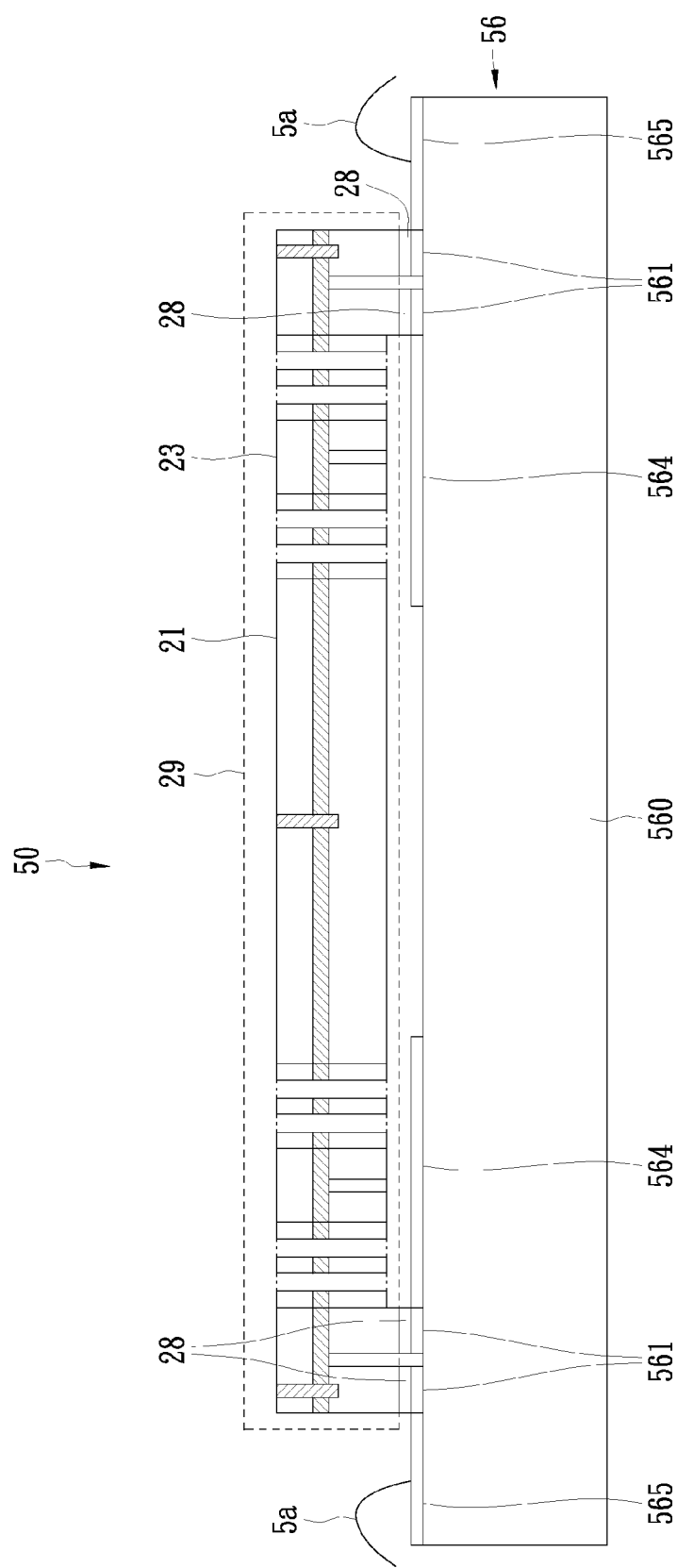
FIG. 5 is a cross sectional view of a MEMS device having an insulating structure of an embodiment of the disclosure.

FIG. 5 is a cross sectional view of a MEMS device having an electrical insulating structure of an embodiment of the disclosure. In contrast to the MEMS device 40 in FIG. 4, the MEMS device 50 of this embodiment comprises a substrate 560 that can be a glass substrate, a plurality of metal bonding areas 561, a plurality of conductive traces 564 and a plurality of conductive bonding pads 565. The plurality of metal bonding areas 561, the plurality of conductive traces 564 and the plurality of conductive bonding pads 565 are disposed on a surface of the glass substrate 560. The sensing element 29 is bonded with the plurality of metal bonding areas 561 by the conductive bonding material 28. A plurality of metal wires 5a are bonded with the plurality of conductive bonding pads 565 respectively, thereby the electrical signals of the first moving part 21 and second moving part 23 can be transmitted outward through different and insulated electrical path.

Figure 6:
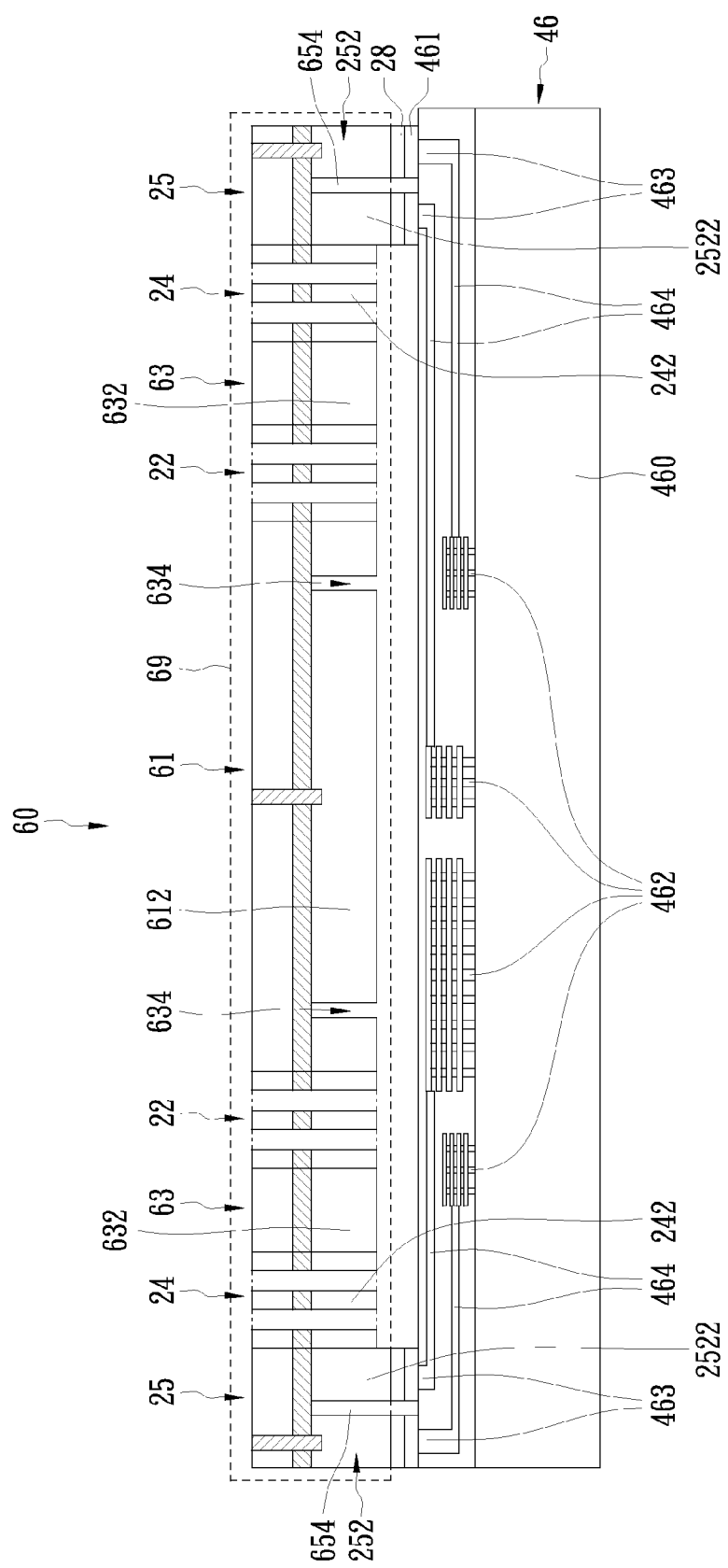
FIG. 6 is a cross sectional view of a MEMS device having an insulating structure of an embodiment of the disclosure.

FIG. 6 is a cross sectional view of a MEMS device having an electrical insulating structure of an embodiment of the disclosure. In contrast to the MEMS device 40 in FIG. 4, the second trench 634 of the sensing element 69 of the MEMS device 60 of the present embodiment is disposed on periphery of the second conductive portion 612 of the first moving part 61, instead of being disposed on the second conductive portion 632 of the second moving part 63. Because the electrical signal of the first moving part 61 is insulated by the second trench 634, the electrical signal of the first moving part 61 cannot be transmitted to the second conductive portion 632 of the second moving part 63. The electrical signal of the second moving part 63, therefore, can be transmitted outward independently through the second conductive portion 632 of the second moving part 63, the second conductive portion 242 of the at least one second spring 24 and the inner conductive portion 2522 of the at least one anchor 25. It is noted that, the first trench 654 disposed in the second conductive portion 252 of the at least one anchor 25 can also be filled with the insulating material to from an insulating wall (not shown).

Figure 7:
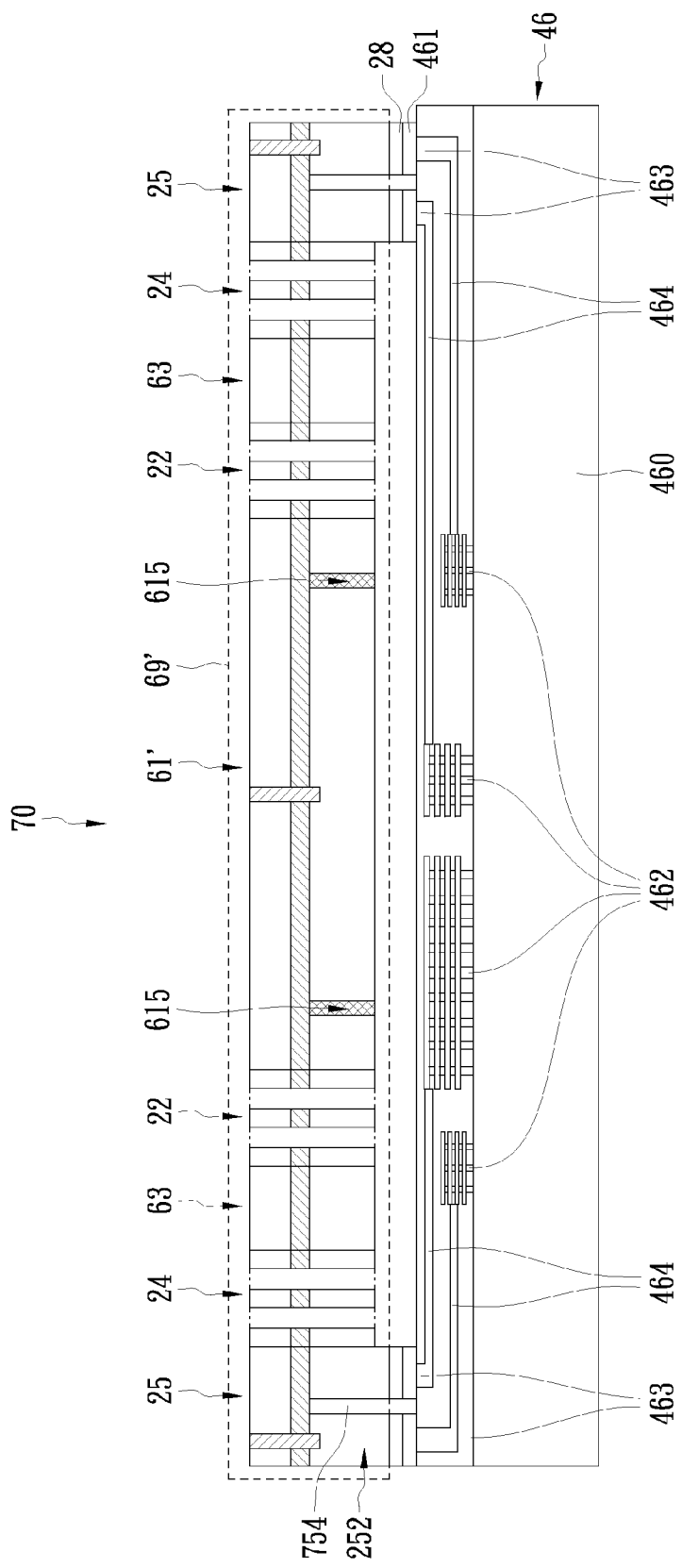
FIG. 7 is a cross sectional view of a MEMS device having an insulating structure of an embodiment of the disclosure.

FIG. 7 is a cross sectional view of a MEMS device having an electrical insulating structure of an embodiment of the disclosure. In contrast to the MEMS device 60 in FIG. 6, the MEMS device 70 of the this embodiment comprises a second trench filled with electrical insulating material to form an insulating wall 615 in the second conductive portion of the first moving part 61' of the sensing element 69'. It is noted that, the first trench 754 disposed in the second conductive portion 252 of the anchor 25 can also be filled with the insulating material to from an insulating wall (not shown).

Figure 8:
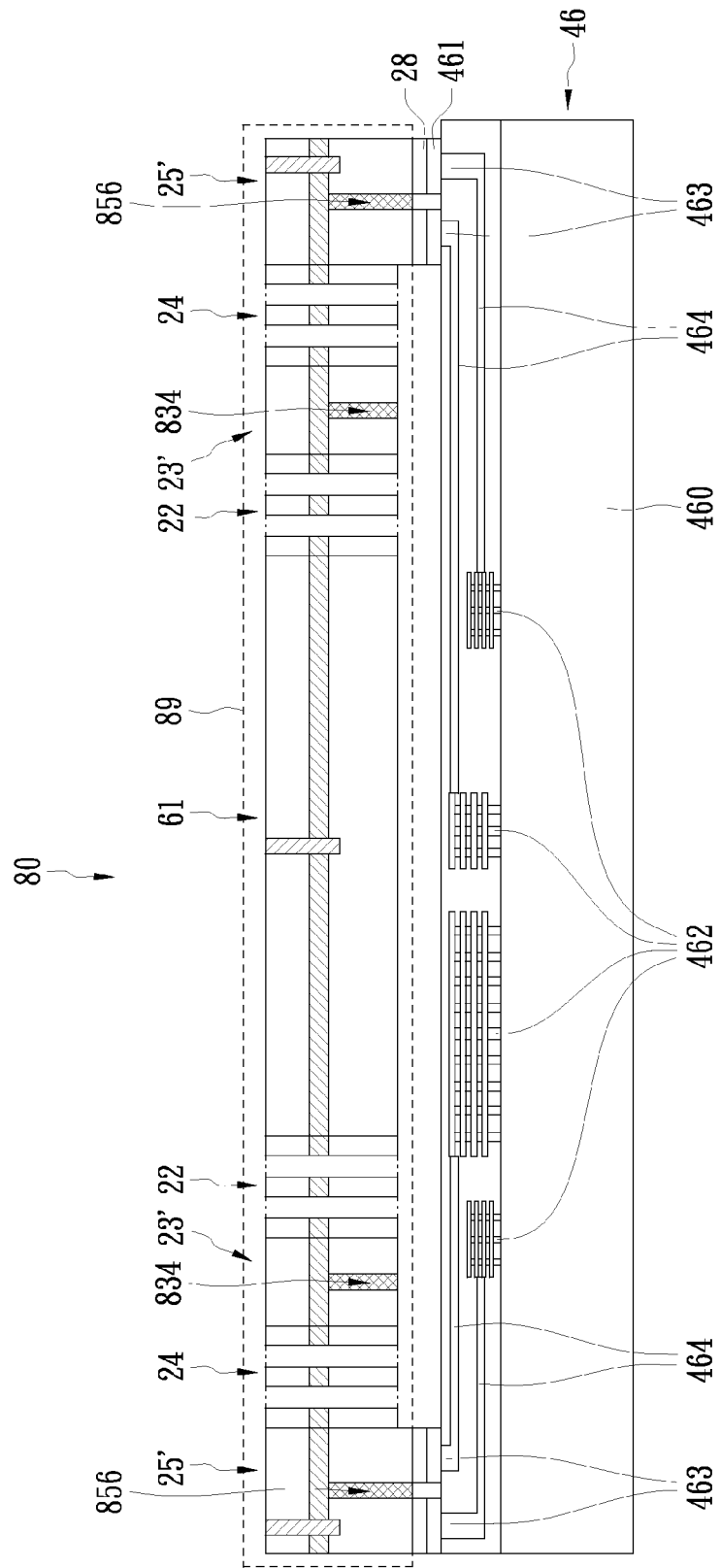
FIG. 8 is a cross sectional view of a MEMS device having an insulating structure of an embodiment of the disclosure.

FIG. 8 is a cross sectional view of a MEMS device having an electrical insulating structure of an embodiment of the disclosure. The second trench of the second moving part 23' of the MEMS device 80 of the present embodiment is also filled with electrical insulating material to form an insulating wall 834 in the second conductive portion of the second moving part 23'. The first trench of the at least one anchor 25' is also filled with electrical insulating material to form an insulating wall 856 in the second conductive portion of the at least one anchor 25'.

Figure 9:
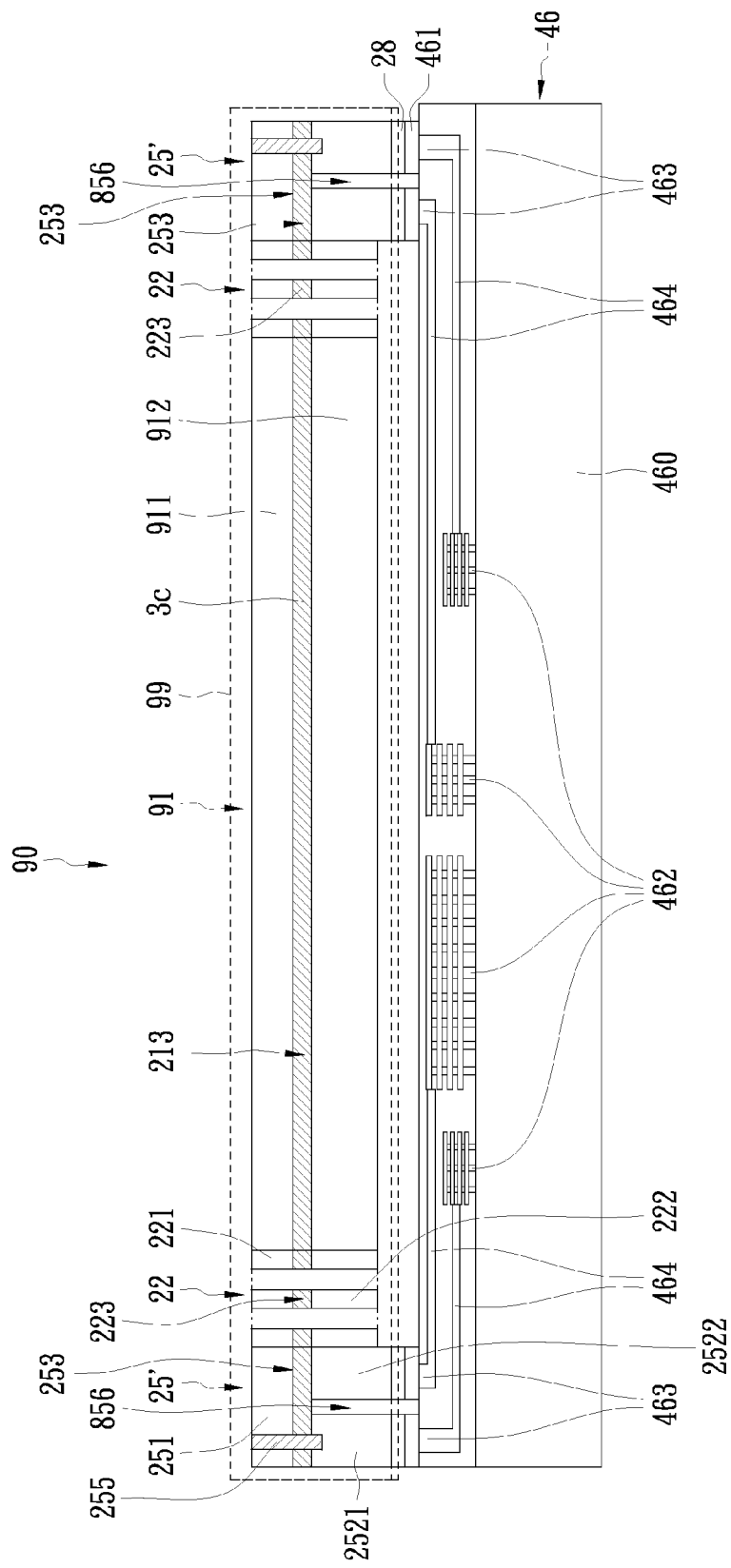
FIG. 9 is a cross sectional view of a MEMS device having an insulating structure of an embodiment of the disclosure.

FIG. 9 is a cross sectional view of a MEMS device having an electrical insulating structure of an embodiment of the disclosure. The MEMS device 90 includes a substrate 46, a first moving part 91, at least one first spring 22 and at least one anchor 25'. The at least one first spring 22 are connected to the first moving part 91 and the at least one anchor 25'. The first conductive portion 911 and the second conductive portion 912 of the first moving part 91 have an upper and a lower electrical path, respectively, wherein the upper and the lower electrical paths are electrically insulated. The electrical signal from the first conductive portion 911 of the first moving part 91 can be transmitted outward independently through the first conductive portion 221 of the at least one first spring 22, the first conductive portion 251 of the at least one anchor 25', the first conductive pillar 255 and the outer conductive portion 2521 of the at least one anchor 25'. The electrical signal from the second conductive portion 912 of the first moving part 91 can be transmitted outward independently through the second conductive portion 222 of the at least one first spring 22 and the inner conductive portion 2522 of the at least one anchor 25'.

Figure 10A:
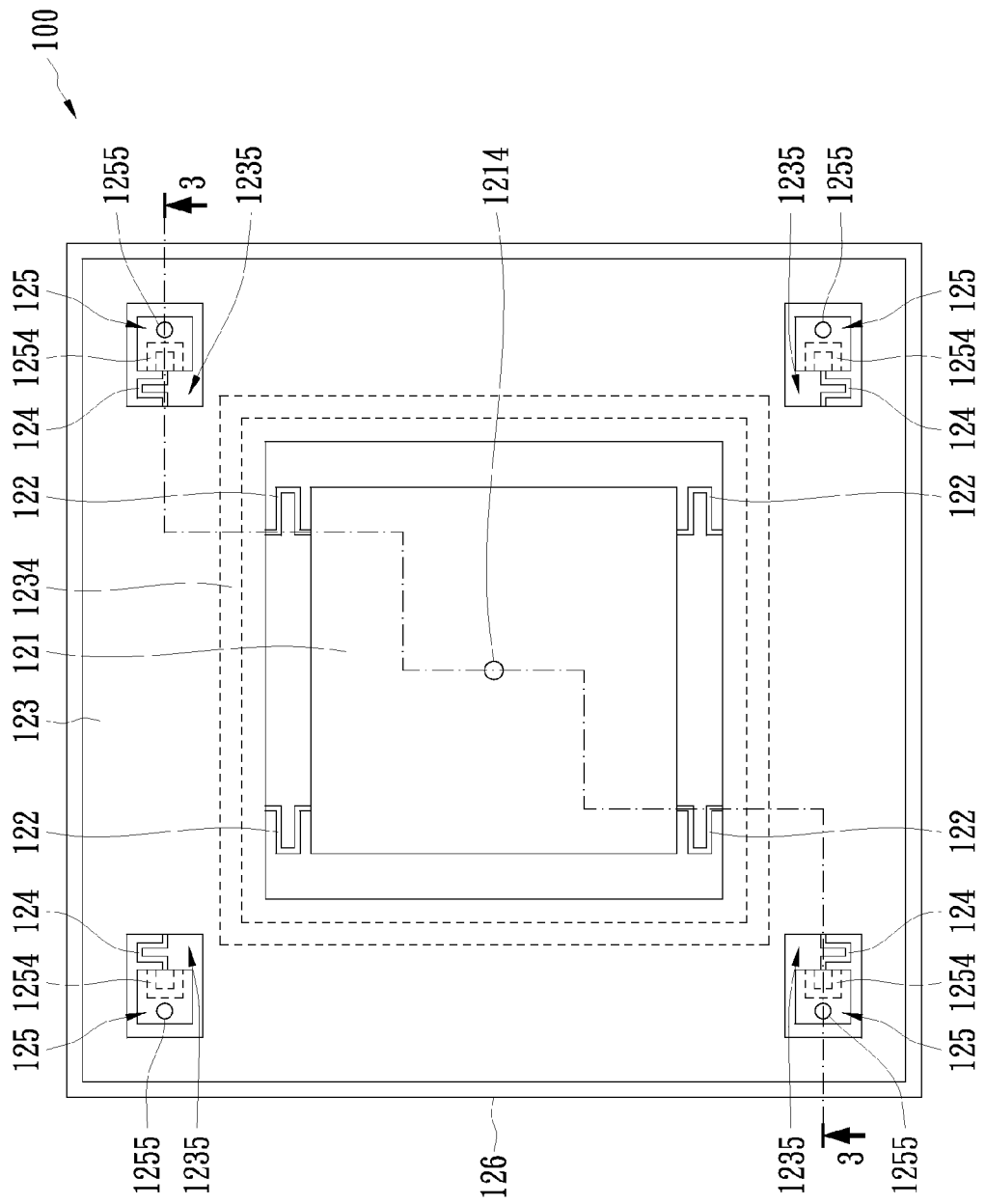
FIG. 10A is a top view of a MEMS device having an insulating structure of an embodiment of the disclosure.
Figure 10B:
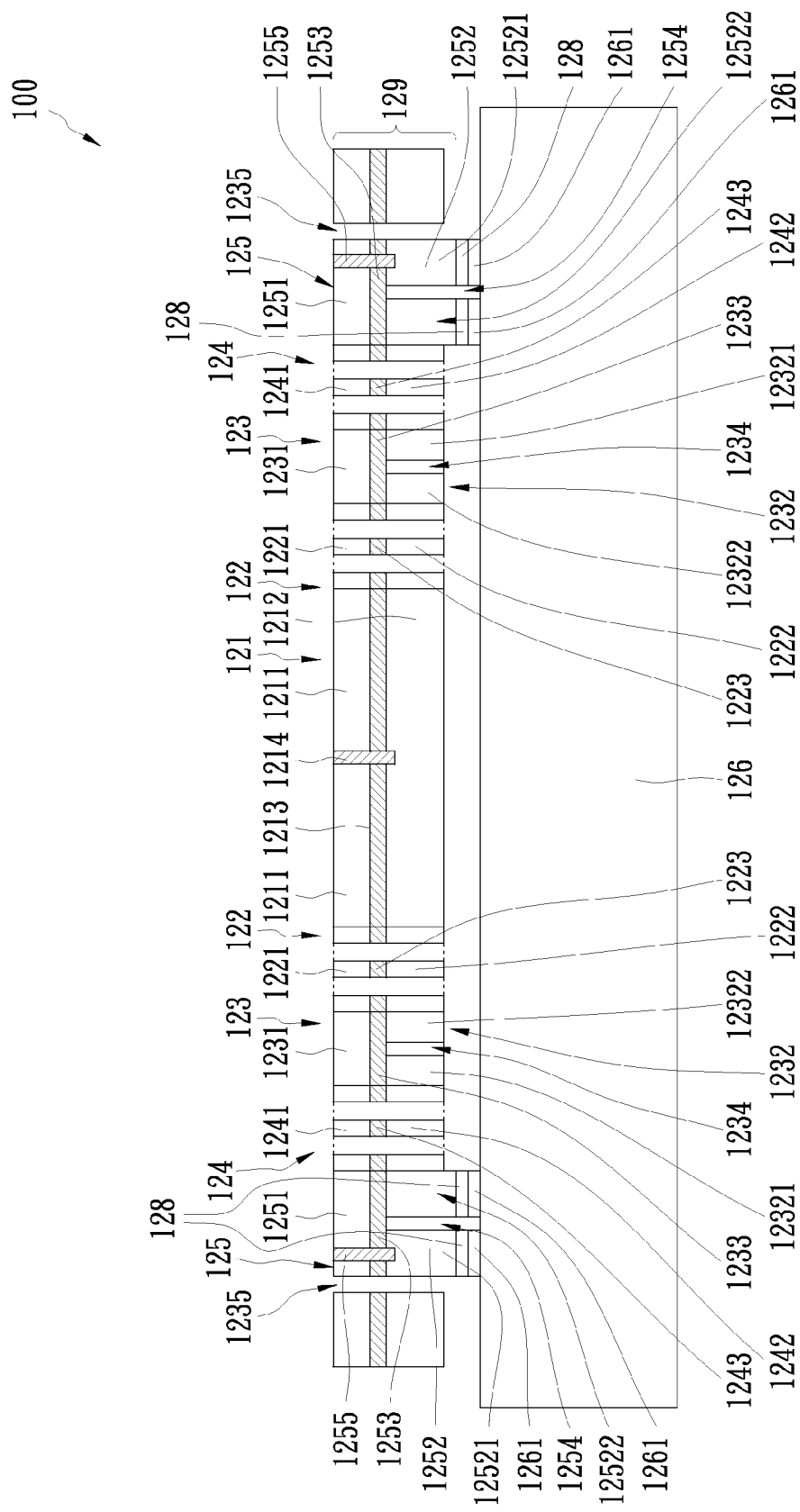
FIG. 10B is a cross sectional view taken along the line 3-3 in FIG. 10A.

FIG. 10A is a top view of the MEMS device having electrical insulating structure of an embodiment of the disclosure. FIG. 10B is a cross sectional view taken along the line 3-3 in FIG. 10A. The MEMS device 100 includes a substrate 126, a first moving part 121, a second moving part 123, at least one first spring 122, at least one second spring 124, at least one anchor 125 and an insulating layer (1213, 1223, 1233, 1243, 1253). The manufacturing steps of this embodiment are the same as that of the previous embodiment. The first moving part 121, the second moving part 123, each of the at least one first spring 122, each of the at least one second spring 124 and each of the at least one anchor 125 are formed from a SOI (silicon on insulator) wafer. The insulating layer (1213, 1223, 1233, 1243, 1253) is disposed in the first moving part 121, the at least one first spring 122, the second moving part 123, the at least one second spring 124 and the at least one anchor 125 respectively. The first moving part 121 is divided into a first conductive portion 1211 and a second conductive portion 1212 by the insulating layer 1213. The second moving part 123 is divided into a first conductive portion 1231 and a second conductive portion 1232 by the insulating layer 1233. The at least one anchor 125 is divided into a first conductive portion 1251 and a second conductive portion 1252 by the insulating layer 1253. The at least one first spring 122 is divided into a first conductive portion 1221 and a second conductive portion 1222 by the insulating layer 1223. The at least one second spring 124 is divided into a first conductive portion 1241 and a second conductive portion 1242 by the insulating layer 1243.

The at least one first spring 122 is connected to the first moving part 121 and the second moving part 123. The at least one second spring 124 is connected to the second moving part 123 and the at least one anchor 125. Each of the at least one anchor 125 is disposed in an opening 1235 of the second moving part 123 respectively and fixed on the substrate 126. The at least one anchor 125 includes at least one first insulating portion 1254 and at least one first conductive pillar 1255. The at least one first insulating portion 1254 is disposed in the second conductive portion 1252 of the at least one anchor 125, such that the second conductive portion 1252 of the at least one anchor 125 is divided into an outer conductive portion 12521 and an inner conductive portion 12522 by the at least one first insulating portion 1254. The inner conductive portion 12522 is defined as the divided conductive portion which is closer to the center of the first moving part 121. The at least one first conductive pillar 1255 extends through the insulating layer 1253 and the at least one first conductive pillar 1255 connects the outer conductive portion 12521 and the first conductive portion 1251 of the at least one anchor 125. The at least one first insulating portion 1254 can be a strip type trench or a U-shaped trench. The at least one first insulating portion 1254 can also be a strip type trench or a U-shaped trench filled with insulating material to from an insulating wall disposed between the outer conductive portion 12521 and the inner conductive portion 12522. In contrast to the embodiments of FIGS. 2A and 2B, the present embodiment includes at least one anchor 125 that is disposed in an opening 1235 of the second moving part 123, and the at least one second springs 124 is connected to the inner walls of the opening 1235 and the at least one anchor 125.

The first moving part 121 includes at least one second conductive pillar 1214 connected to the first conductive portion 1211 of the first moving part 121 and the second conductive portion 1212 of the first moving part 121. That is, the second conductive pillar 1214 extends through the insulating layer 1213 between the first conductive portion 1211 of the first moving part 121 and the second conductive portion 1212 of the first moving part 121, such that the first conductive portion 1211 of the first moving part 121 and the second conductive portion 1212 of the first moving part 121 are electrically connected. Thus, both the first conductive portion 1211 of the first moving part 121 and the second conductive portion 1212 of the first moving part 121 can function as the proof mass of an inertial sensor such as a gyroscope or accelerometer. The second moving part 123 includes at least one second insulating portion 1234. The at least one second insulating portion 1234 is disposed in the second conductive portion 1232 of the second moving part 123, such that the second conductive portion 1232 of the second moving part 123 is divided into an outer conductive portion 12321 of the second moving part and an inner conductive portion 12322 of the second moving part by the at least one second insulating portion 1234.

Each of the at least one anchor 125 of the sensing element 129 is bonded with a metal bonding area 1261 of the substrate 126 by conductive bonding materials 128 such as silver paste. The outer conductive portion 12521 of the at least one anchor 125 and the inner conductive portion 12522 of the at least one anchor 125 are electrically insulated and are connected respectively to the different metal bonding areas 1261 that are spaced apart.

Figure 11A:
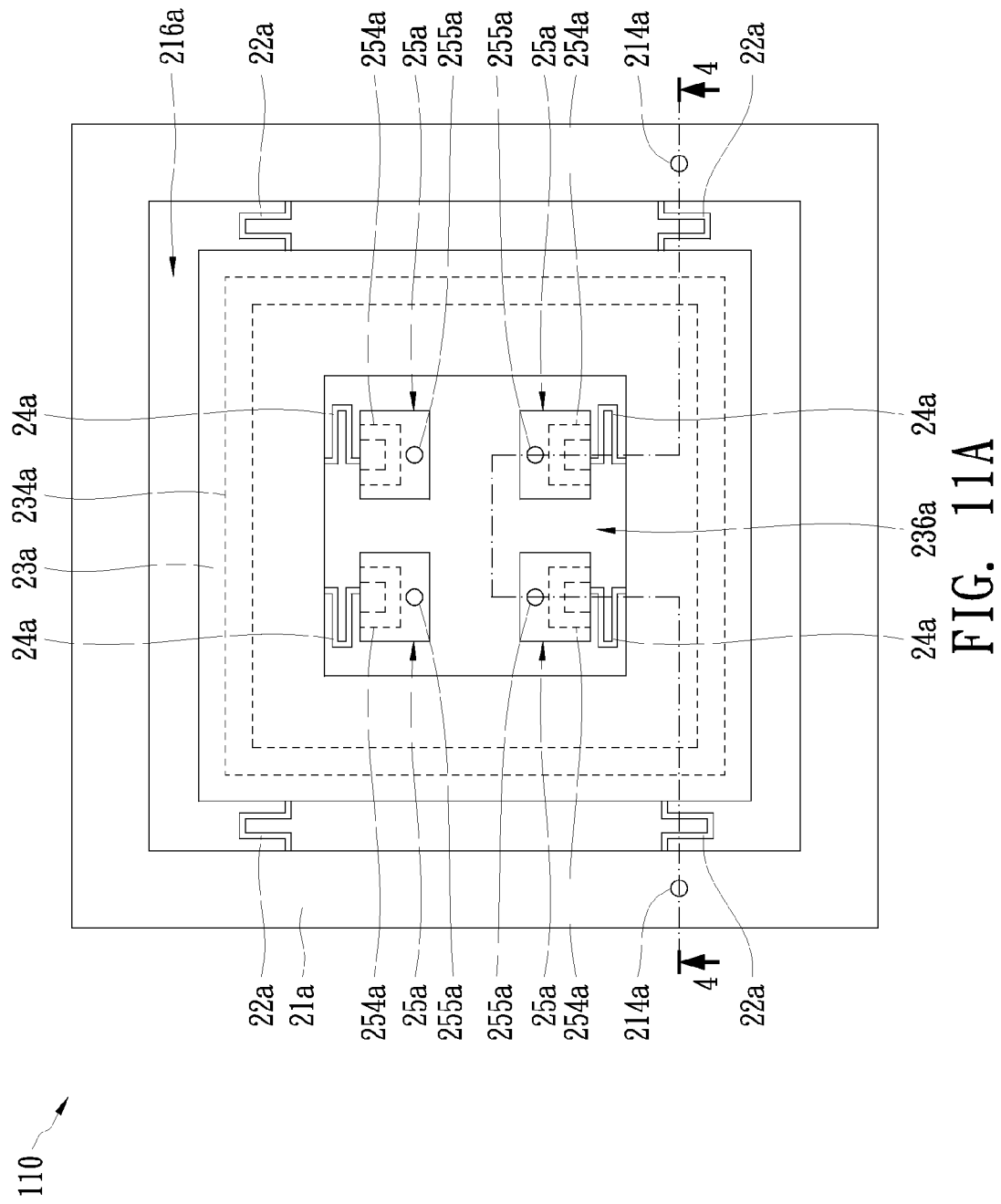
FIG. 11A is a top view of a MEMS device having an insulating structure of one embodiment of the disclosure.
Figure 11B:
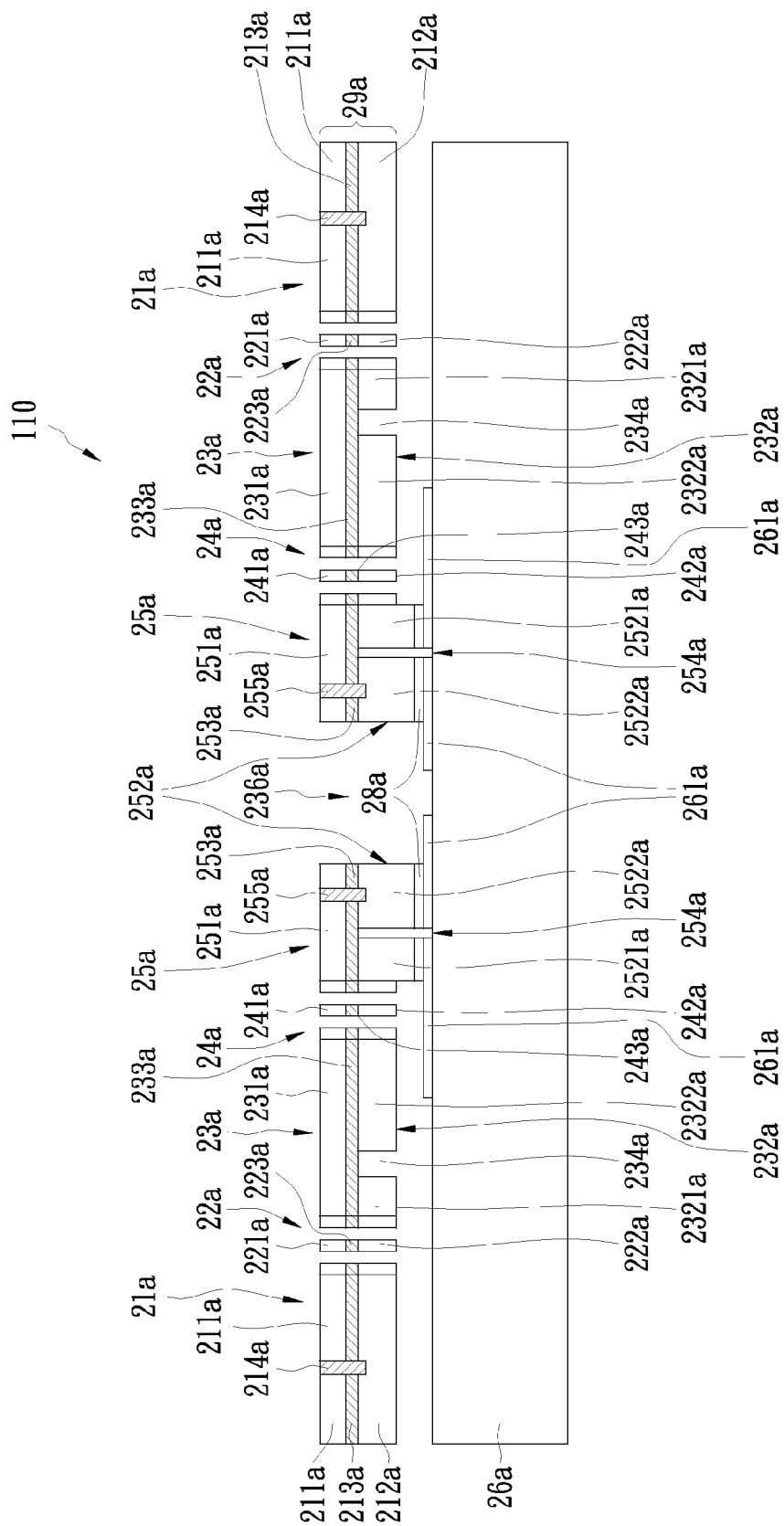
FIG. 11B is a cross sectional view taken along the line 4-4 in FIG. 11A.

FIG. 11A is a top view of a MEMS device having an insulating structure of one embodiment of the disclosure. FIG. 11B is a cross sectional view taken along the line 4-4 in FIG. 11A. The MEMS device 110 includes a substrate 26a, a first moving part 21a, a second moving part 23a, at least one first spring 22a, at least one second spring 24a, at least one anchor 25a and an insulating layer (213a, 223a, 233a, 243a, 253a).

The insulating layer (213a, 223a, 233a, 243a, 253a) is disposed in the first moving part 21a, the at least one first spring 22a, the second moving part 23a, the at least one second spring 24a and the at least one anchor 25a, respectively. The first moving part 21a is divided into a first conductive portion 211a and a second conductive portion 212a by the insulating layer 213a. The second moving part 23a is divided into a first conductive portion 231a and a second conductive portion 232a by the insulating layer 233a. The at least one anchor 25a is divided into a first conductive portion 251a and a second conductive portion 252a by the insulating layer 253a. The at least one first spring 22a is divided into a first conductive portion 221a and a second conductive portion 222a by the insulating layer 223a. The at least one second spring 24a is divided into a first conductive portion 241a and a second conductive portion 242a by the insulating layer 243a.

The at least one first spring 22a is connected to the first moving part 21a and to the second moving part 23a. The at least one second spring 24a is connected to the second moving part 23a and to the at least one anchor 25a. Each of the at least one anchor 25a is disposed in the central opening 236a of the second moving part 23a and fixed on the substrate 26a. The second moving part 23a is disposed in the opening 216a of the first moving part 21a. That is, the first moving part 21a surrounds the second moving part 23a. At least one of the anchor 25a comprises at least one first insulating portion 254a and at least one first conductive pillar 255a. The at least one first insulating portion 254a is disposed in the second conductive portion 252a of the at least one anchor 25a, such that the second conductive portion 252a of the at least one anchor 25a is divided into an outer conductive portion 2521a of the at least one anchor 25a and an inner conductive portion 2522a of the at least one anchor 25a by the at least one first insulating portion 254a. The inner conductive portion 2522a of the at least one anchor 25a is defined as the divided conductive portion which is closer to the center of the central opening 236a. The at least one first conductive pillar 255a extends through the insulating layer 253a and is connected to the inner conductive portion 2522a of the at least one anchor 25a and to the first conductive portion 251a of the at least one anchor 25a. The at least one first insulating portion 254a is disposed between the outer conductive portion 2521a of the at least one anchor 25a and the inner conductive portion 2522a of the at least one anchor 25a. The at least one first insulating portion 254a can be a strip type trench or a U-shaped trench, or the at least one first insulating portion 254a can be a strip type trench or a U-shaped trench filled with insulating material to from an insulating wall disposed between the outer conductive portion 2521a of the at least one anchor 25a and the inner conductive portion 2522a of the at least one anchor 25a.

The first moving part 21a includes at least one second conductive pillar 214a connected to the first conductive portion 211a of the first moving part 21a and the second conductive portion 212a of the first moving part 21a. That is, the at least one second conductive pillar 214a extends through the insulating layer 213a disposed between the first conductive portion 211a of the first moving part 21a and the second conductive portion 212a of the first moving part 21a, such that the first conductive portion 211a and the second conductive portion 212a are electrically connected. Thus, both the first conductive portion 211a of the first moving part 21a and the second conductive portion 212a of the first moving part 21a can function as a proof mass of an inertial sensor such as a gyroscope or accelerometer. The second moving part 23a comprises at least one second insulation portion 234a. The at least one second insulating portion 234a is disposed in the second conductive portion 232a of the second moving part 23a, such that the second conductive portion 232a of the second moving part 23a is divided into an outer conductive portion 2321a of the second moving part 23a and an inner conductive portion 2322a of the second moving part 23a by the at least one second insulating portion 234a.

The at least one anchor 25a of the sensing element 29a are bonded with the plurality of metal bonding areas 261a of the substrate 26a by conductive bonding material 28a such as silver paste. The outer conductive portion 2521a of the at least one anchor 25a and the inner conductive portion 2522a of the at least one anchor 25a are electrically insulated and are connected respectively to the different metal bonding areas 261a that are spaced apart.

Figure 12A:
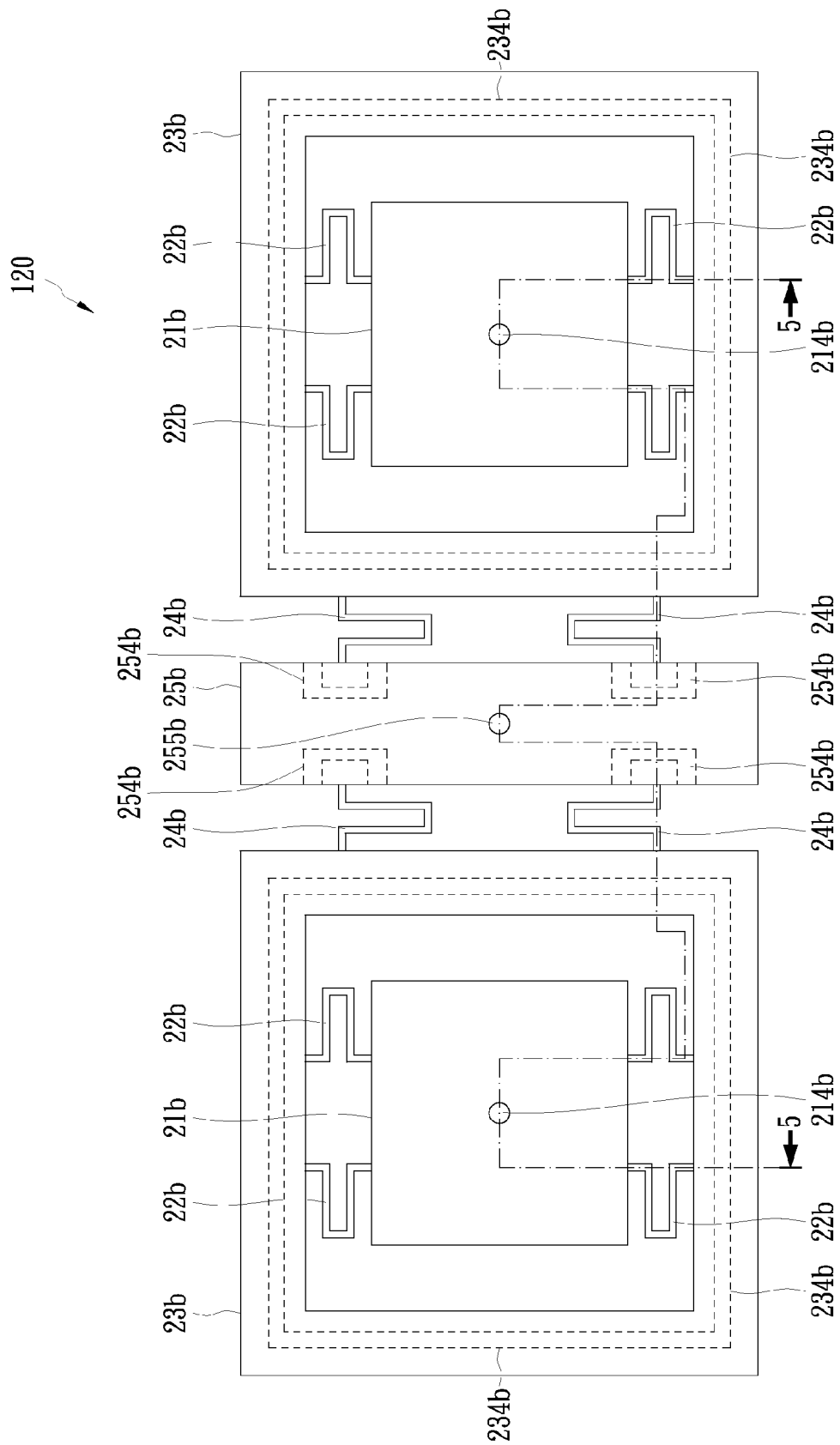
FIG. 12A is a top view of a MEMS device having an insulating structure of one embodiment of the disclosure.
Figure 12B:
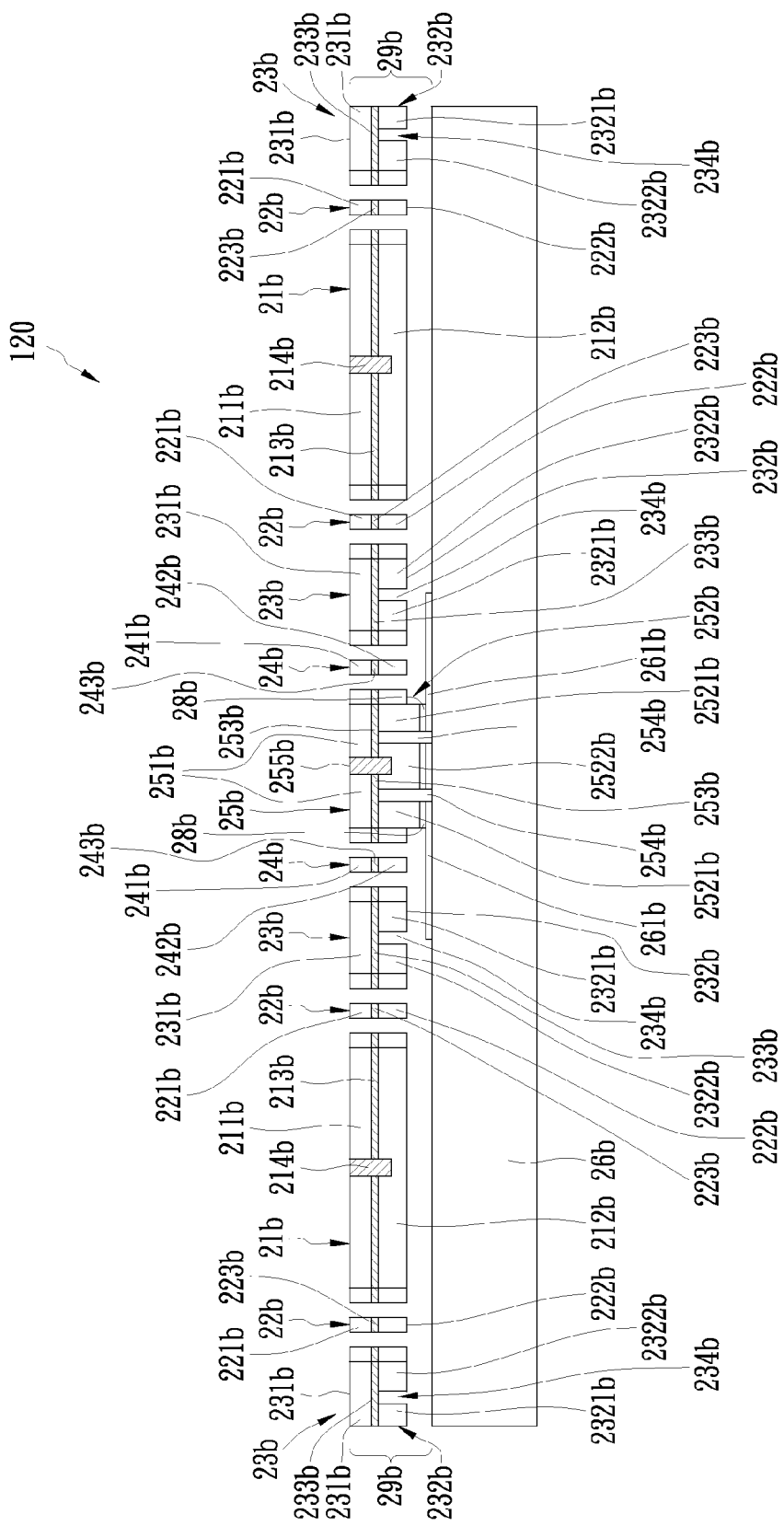
FIG. 12B is a cross sectional view taken along the line 5-5 in FIG. 12A.

FIG. 12A is a top view of a MEMS device having an insulating structure of one embodiment of the disclosure. FIG. 12B is a cross sectional view taken the line 5-5 in FIG. 12A. The MEMS device 120 includes a substrate 26b, two first moving parts 21b, two second moving parts 23b, at least one first spring 22b, at least one second spring 24b, an anchor 25b and an insulating layer (213b, 223b, 233b, 243b, 253b). The first moving parts 21b, the second moving parts 23b, each of the at least one first spring 22b, each of the at least one second spring 24b and an anchor 25b are formed from a SOI (silicon on insulator) wafer.

The insulating layer (213b, 223b, 233b, 243b, 253b) is disposed in the first moving part 21b, the at least one first spring 22b, the second moving part 23b, the at least one second spring 24b and the anchor 25b, respectively. The first moving part 21b is divided into a first conductive portion 211b and a second conductive portion 212b by the insulating layer 213b. The second moving part 23b is divided into a first conductive portion 231b and a second conductive portion 232b by the insulating layer 233b. The anchor 25b is divided into a first conductive portion 251b and a second conductive portion 252b by the insulating layer 253b. The at least one first spring 22b is divided into a first conductive portion 221b and a second conductive portion 222b by the insulating layer 223b. The at least one second spring 24b is divided into a first conductive portion 241b and a second conductive portion 242b by the insulating layer 243b.

The at least one first spring 22b is connected to the first moving part 21b and to the second moving part 23b. The at least one second spring 24b is connected to the second moving part 23b and to the anchor 25. The anchor 25 is disposed between the two second moving parts 23b and fixed on the substrate 26b. The MEMS device 120 of the present embodiment includes two sensing elements 29b, which share the same anchor 25b. The anchor 25b comprises at least one first insulating portion 254b and at least one first conductive pillar 255b. The at least one first insulating portion 254b is disposed in the second conductive portion 252b of the anchor 25b, such that the second conductive portion 252b of the anchor 25b is divided into an outer conductive portion 2521b of the anchor 25b and an inner conductive portion 2522b of the anchor 25b by the at least one first insulating portion 254b. The outer conductive portion is defined as the divided conductive portion which connects the at least one second spring 24b. The at least one first conductive pillar 255b extends through the insulating layer 253b and is connected to the inner conductive portion 2522b of the anchor 25b and to the first conductive portion 251b of the anchor 25b. The at least one first insulating portion 254b is disposed between the outer conductive portion 2521b of the anchor 25b and an inner conductive portion 2522b of the anchor 25b. The at least one first insulating portion 254b can be a U-shaped trench, or the at least one first insulating portion 254b can be a U-shaped trench filled with insulating material to from an insulating wall disposed between the outer conductive portion 2521b of the anchor 25b and the inner conductive portion 2522b of the anchor 25b. The outer conductive portion 2521b of the anchor 25b and the inner conductive portion 2522b of the anchor 25b are electrically insulated from each other and are bonded with the different metal bonding areas 261b of the substrate 26b by conductive bonding material 28b such as silver paste.

The first moving part 21b includes at least one second conductive pillar 214b connected to the first conductive portion 211b of the first moving part 21b and the second conductive portion 212b of the first moving part 21b. That is, the at least one second conductive pillar 214b extends through the insulating layer 213b between the first conductive portion 211b of the first moving part 21b and the second conductive portion 212b of the first moving part 21b, such that the first conductive portion 211b of the first moving part 21b and the second conductive portion 212b of the first moving part 21b are electrically connected. Thus, both of the first conductive portion 211b of the first moving part 21b and the second conductive portion 212b of the first moving part 21b can function as the proof mass of an inertial sensor such as a gyroscope or accelerometer. Each of the second moving parts 23b includes at least one second insulation portion 234b. The at least one second insulating portion 234b is disposed in the second conductive portion 232b of the second moving part 23b, such that the second conductive portion 232b of the second moving part 23b is divided into an outer conductive portion 2321b and an inner conductive portion 2322b by the at least one second insulating portion 234b.

The outer conductive portion 2521b of the anchor 25 and the inner conductive portion 2522b of the anchor 25 can be connected to the different metal bonding areas 261b respectively by conductive bonding material 28b such as silver paste.

Although the disclosure and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, manufacture, means, methods and steps described in the specification. As one of ordinary skill in the art will readily appreciate from the disclosure of the disclosure, processes, manufacture, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, manufacture, means, methods, or steps.

What is claimed is:

1. A method for manufacturing a MEMS device, the method comprising:

providing a Silicon on Insulator (SOI) wafer, wherein the SOI wafer includes a device layer, an insulating layer and a handle layer;

etching the device layer to form a recess and at least one annular protrusion surrounding the recess;

forming at least one first trench in the annular protrusion and forming, in the device layer, a second trench on the recess, wherein the at least one first trench and the second trench extend to the insulating layer;

bonding the annular protrusion with a substrate including a plurality of metal bonding areas disposed on an upper surface of the substrate;

thinning the handle layer;

forming a plurality of first holes in a portion of the handle layer corresponding to the at least one first trench and forming at least one second hole in a portion of the handle layer corresponding to a middle area of the recess, wherein the plurality of first holes and the at least one second hole extend through the insulating layer to the device layer;

filling the plurality of first holes and the at least one second hole with conductive material to create a plurality of first conductive pillar and at least one second conductive pillar;

forming, on the recess, at least one first moving part, at least one second moving part, a plurality of first springs connected to the first moving part and the second moving part, and a plurality of second springs by etching the device layer, the insulating layer and the handle layer corresponding to the recess, wherein the insulating layer is disposed between a first conductive portion of the at least one first moving part and a second conductive portion of the at least one first moving part, wherein the insulating layer is disposed between a first conductive portion of the at least one second moving part and a second conductive portion of the at least one second moving part, wherein the insulating layer is disposed between a first conductive portion of at least one first spring of the plurality of first springs and a second conductive portion of the at least one first spring, and wherein the insulating layer is disposed between a first conductive portion of at least one second spring of the plurality of second springs and a second conductive portion of the at least one second spring; and forming at least one anchor at the annular protrusion by etching the device layer, the insulating layer and the handle layer, wherein the plurality of second springs connects to the second moving part and the at least one anchor, and wherein the insulating layer is disposed between a first conductive portion of the at least one anchor and a second conductive portion of the at least one anchor, wherein the first conductive portion of the at least one first spring is connected to the first conductive portion of the at least one first moving part and the first conductive portion of the at least one second moving part, and the first conductive portion of the at least one second spring is connected to the first conductive portion of the at least one second moving part and to the first conductive portion of the at least one anchor;

wherein the at least one first moving part comprises the at least one second conductive pillar connected to the first conductive portion of the at least one first moving part and to the second conductive portion of the at least one first moving part;

wherein the at least one anchor comprises at least one first trench and the at least one first conductive pillar, the second conductive portion of the at least one anchor is divided into an outer conductive portion and an inner conductive portion by the at least one first trench, the at least one first conductive pillar is connected to the outer conductive portion and the first conductive portion of the at least one anchor, and the outer conductive portion and the inner conductive portion of the at least one anchor are respectively fixed on the plurality of metal bonding areas that are spaced apart;

wherein the at least one second moving part has a second trench, the second conductive portion of the at least one second moving part is divided into an outer conductive portion and an inner conductive portion by the second trench;

wherein the second conductive portion of the at least one first spring is connected to the second conductive portion of the at least one first moving part and to the inner conductive portion of the at least one second moving part; and wherein the second conductive portion of the at least one second spring is connected to the outer conductive portion of the at least one second moving part and the inner conductive portion of the at least one anchor.

2. A method for manufacturing a MEMS device, the method comprising:

provoding a Silicon on Insulator (SOI) wafer, wherein the SOI wafer includes a device layer, an insulating layer and a handle layer;

etching the device layer to form a recess and at least one annular protrusion surrounding the recess;

forming at least one first trench in the annular protrusion, wherein the at least one first trench extends to the insulating layer;

bonding the annular protrusion with a substrate;

thinning the handle layer;

forming a plurality of first holes in a portion of the handle layer corresponding to the at least one first trench, wherein the plurality of first holes extends through the insulating layer to the device layer;

filling the plurality of first holes with conductive material to form a plurality of first conductive pillar;

forming, on the recess, at least one moving part and at least one spring by etching the device layer, the insulating layer and the handle layer corresponding to the recess, wherein the insulating layer is disposed between a first conductive portion of the at least one moving part and a second conductive portion of the at least one moving part;

forming at least one anchor at the annular protrusion by etching the device layer, the insulating layer and the handle layer, wherein the insulating layer is disposed between a first conductive portion of the at least one anchor and a second conductive portion of the at least one anchor, wherein the at least one spring is connected to the at least one anchor and the at least one moving part, and wherein the at least one first conductive pillar connects the first conductive portion of the at least one anchor and the second conductive portion of the at least one anchor, respectively.

3. The method of claim 2, further including the step of etching a second trench on the recess, wherein the second trench extends to the insulating layer.

4. The method of claim 3, further including the step of filling the first trench and the second trench with electrical insulating materials to form an insulating wall.

5. The method of claim 3, wherein the second trench is disposed on the second moving part.

6. The method of claim 3, wherein the second trench is disposed on the first moving part and arranged around the periphery of the second hole.

7. The method of claim 2, wherein the first trench is disposed on the at least one anchor, the second conductive portion of the at least one anchor is divided into an outer conductive portion and an inner conductive portion by the at least one first trench.

8. The method of claim 7, wherein the at least one first conductive pillar is connected to the outer conductive portion and the first conductive portion of the at least one anchor.

9. The method of claim 2, wherein a substrate has a plurality of metal bonding areas disposed on an upper surface of the substrate, the at least one anchor is fixed on the substrate, and the at least one spring is divided into a first conductive portion and a second conductive portion by the insulating layer, wherein the at least one anchor comprises the at least one first trench and the at least one first conductive pillar, the second conductive portion of the at least one anchor is divided into an outer conductive portion and an inner conductive portion by the at least one first trench, the at least one first conductive pillar is connected to the outer conductive portion and the first conductive portion of the at least one anchor, and the outer conductive portion and the inner conductive portion of the at least one anchor are respectively fixed on the metal bonding areas that are spaced apart, wherein the first conductive portion of the at least one spring is connected to the first conductive portion of the at least one anchor, and wherein the second conductive portion of the at least one spring is connected to the inner conductive portion of the at least one anchor.

10. The method of claim 9, wherein the substrate has a plurality of metal bonding areas, and the outer conductive portion and the inner conductive portion of the at least one anchor are respectively fixed on the plurality of metal bonding areas that are spaced apart.

* * * * *